US010411709B1

(12) United States Patent
Ghasemi et al.

(10) Patent No.: US 10,411,709 B1
(45) Date of Patent: Sep. 10, 2019

(54) CIRCUIT ARRANGEMENTS AND METHODS FOR DIVIDING A THREE-DIMENSIONAL INPUT FEATURE MAP

(71) Applicant: Xilinx, Inc., San Jose, CA (US)

(72) Inventors: Ehsan Ghasemi, San Jose, CA (US); Elliott Delaye, San Jose, CA (US); Ashish Sirasao, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/045,657

(22) Filed: Jul. 25, 2018

(51) Int. Cl.
*H03K 19/173* (2006.01)
*G06F 17/50* (2006.01)
*H03K 19/177* (2006.01)
*G06F 12/0802* (2016.01)

(52) U.S. Cl.
CPC ..... *H03K 19/1737* (2013.01); *G06F 12/0802* (2013.01); *G06F 17/5054* (2013.01); *H03K 19/1776* (2013.01); *H03K 19/17704* (2013.01)

(58) Field of Classification Search
None
See application file for complete search history.

(56) References Cited

U.S. PATENT DOCUMENTS

| 6,346,825 | B1 | 2/2002 | Pang et al. | |
|---|---|---|---|---|
| 2018/0247180 | A1* | 8/2018 | Cheng | G06K 9/46 |
| 2018/0253636 | A1* | 9/2018 | Lee | G06N 3/02 |

OTHER PUBLICATIONS

Akesson, Benny, "An introduction to SDRAM and memory controllers," downloaded Sep. 25, 2017 from http://www.es.ele.tue.nl/premadona/files/akesson01.pdf, pp. 1-30, Eindhoven University of Technology, Eindhoven, The Netherlands.
Chetlur, Sharan et al., "cuDNN: Efficient Primitives for Deep Learning," submitted Oct. 3, 2014, pp. 1-9, https://arxiv.org/pdf/1410.0759.pdf, Cornell University Library.
Di Carlo, Stefano et al., "An Area-Efficient 2-D Convolution Implementation on FPGA for Space Applications," Proc. of the 2011 IEEE 6th International Design & Test Workshop, Dec. 11, 2011, pp. 88-92, IEEE, Piscataway, New Jersey, USA.
Gysel, Philipp, "Ristretto: Hardware-Oriented Approximation of Convolutional Neural Networks," May 20, 2016, pp. 1-73, https://arxiv.org/abs/1605.06402, Cornell University Library.

(Continued)

*Primary Examiner* — Jany Richardson
(74) *Attorney, Agent, or Firm* — LeRoy D. Maunu

(57) ABSTRACT

Disclosed circuits and methods include N line buffers. Each line buffer is configured for storage of M data elements of a three-dimensional (3-D) input feature map (IFM). A request generator circuit is coupled to the N line buffers and to a memory configured for storage of the 3-D IFM. The request generator circuit is divides the 3-D IFM into a plurality of IFM sub-volumes based on values of N, M, and dimensions of the 3-D IFM. The request generator circuit reads from the memory, data elements at addresses of an unprocessed one of the IFM sub-volumes and stores the data elements of the unprocessed one of the IFM sub-volumes in the N line buffers. In response to a completion signal, the request generator circuit repeats the reading of an unprocessed one of the IFM sub-volumes and storing the data elements in the N line buffers.

20 Claims, 25 Drawing Sheets

(56) References Cited

OTHER PUBLICATIONS

Khronos, "clSetKernelArg," downloaded Sep. 22, 2017 from https://www.khronos.org/registry/OpenCL/sdk/1.0/docs/man/xhtml/clSetKernelArg.html, copyright 2007, pp. 1-4, Khronos Group, Beaverton, Oregon, USA.

Krizhevsky, Alex et al., "ImageNet Classification with Deep Convolutional Neural Networks," Proc. of the 12th International Conference on Neural Processing Systems, Dec. 3, 2012, pp. 1097-1105, ACM Digital Library, www.acm.org.

Mathworks, "im2col," dowloaded Sep. 22, 2017 from https://www.mathworks.com/help/images/ref/im2col.html?searchHighlight=im2col&s_tid=doc_srchtitle, pp. 1-3.

Saxena, Abhineet, "Convolutional Neural Networks (CNNs): An Illustrated Explanation," Jun. 20, 2016, downloaded Sep. 25, 2017 from http://xrds.acm.org/blog/2016/06/convolutional-neural-networks-cnns-illustrated-explanation/, p. 1-15.

Shaaban, Muhammed, "Systolic Architectures," Mar. 11, 2003, Kate Gleason College of Engineering, Rochester Institute of Technology, Rochester, New York, USA.

Stanford, "CS231n Convolutional Neural Networks for Visual Recognition," downloaded Sep. 25, 2017 from http://cs231n.stanford.edu/, pp. 1-23, Stanford University, Stanford, California, USA.

Warden, Pete, "Why GEMM is at the heart of deep learning," Apr. 20, 2015, pp. 1-9, downloaded from https://petewarden.com/2015/04/20/why-gemm-is-at-the-heart-of-deep-learning/.

Wikpedia, "Convolutional neural network," Sep. 20, 2017, pp. 1-13, downloaded from https://en.wikipedia.org/wiki/Convolutional_neural_network.

Wikipedia, "Deep learning," Sep. 24, 2017, pp. 1-13, downloaded from https://en.wikipedia.org/wiki/Deep_learning.

Wikipedia, "Matrix Multiplication," Sep. 20, 2017, pp. 1-19, downloaded from https://en.wikipedia.org/wiki/Matrix_multiplication.

Wikipedia, "Multiprocessing," May 10, 2017, pp. 1-4, dowloaded from https://en.wikipedia.org/wiki/Multiprocessing.

Wikipedia, "Producer-consumer problem," Sep. 7, 2017, pp. 1-9, downloaded from https://en.wikipedia.org/wiki/Producer%E2%80%93consumer_problem.

Wikipedia, "Row- and colum-major order," Aug. 23, 2017, pp. 1-5, downloaded from https://en.wikipedia.org/wiki/Row-_and_column-major_order.

Wikipedia, "Systolic array," Mar. 22, 2017, pp. 1-5, downloaded from https://en.wikipedia.org/wiki/Systolic_array.

Wikipedia, "Very long instruction word," Jul. 13, 2017, pp. 1-3, downloaded from https://en.wikipedia.org/wiki/Very_long_instruction_word.

Xilinx, "Smarter Data Center," downloaded Sep. 22, 2017 from https://www.xilinx.com/applications/data-center.html, pp. 1-4, Xilinx, Inc., San Jose, California, USA.

Xilinx, "SDSoC Development Environment," downloaded Sep. 22, 2017 from https://www.xilinx.com/products/design-tools/software-zone/sdsoc.html, pp. 1-16, Xilinx, Inc., San Jose, California, USA.

Xilinx, "UltraScale Architecture DSP Slice User Guide," UG579 (v1.3), Nov. 24, 2015, pp. 1-74, Xilinx, Inc., San Jose, California, USA.

Xilinx, "Vivado High-Level Synthesis," downloaded Sep. 22, 2017 from https://www.xilinx.com/products/design-tools/vivado/integration/esl-design.html, pp. 1-2, Xilinx, Inc., San Jose, California, USA.

Xilinx, "Deep Learning with INT8 Optimization on Xilinx Devices," WP486 (v1.0.1), Apr. 24, 2017, pp. 1-11, Xilinx, Inc., San Jose, California, USA.

Xilinx, "Implementing Memory Structures for Video Processing in the Vivado HLS Tool," XAPP793 (v1.0), Sep. 20, 2012, pp. 1-8, Xilinx, Inc., San Jose, California, USA.

Xilinx, "Two-Dimensional Linear Filtering," XAPP933 (v1.1), Oct. 23, 2007, pp. 1-8, Xilinx, Inc., San Jose, California, USA.

* cited by examiner

CIRCUIT ARRANGEMENTS AND METHODS FOR DIVIDING A THREE-DIMENSIONAL INPUT FEATURE MAP

TECHNICAL FIELD

The disclosure generally relates to a circuit configured to divide three-dimensional input feature maps using varied parameters.

BACKGROUND

Convolutional neural networks (CNNs) are used in a variety of applications, including for example, image processing. Convolution operations include a summation of each element of an input feature map (IFM) with neighboring elements that are weighted by a filter, which is also referred to as a kernel.

CNNs include multiple layers in which each layer performs a convolution operation on a three-dimensional volume that includes multiple sets of two-dimensional IFMs. In CNN implementations involving Graphic Processing Units (GPUs), the GPU restructures the convolution operation as a matrix multiplication operation by extracting local neighboring elements of each element of the IFM and expanding the volume into matrix format before performing the matrix multiplication. The out-of-order access pattern for extracting the local neighboring elements is limited by the memory available for static expansion of the IFM. Because of the high ratio of computational capacity to memory in field programmable gate arrays (FPGAs), static expansion of the volume is not feasible in FPGA accelerators due to the latency and bandwidth limitations required to run the FPGA at high efficiency.

SUMMARY

A circuit arrangement disclosed herein includes a plurality of N line buffers. Each line buffer is configured for storage of M data elements of a three-dimensional (3-D) input feature map (IFM). The circuit arrangement includes a request generator circuit coupled to the N line buffers and to a memory configured for storage of the 3-D IFM. The request generator circuit is configured to divide the 3-D IFM into a plurality of IFM sub-volumes based on values of N, M, and dimensions of the 3-D IFM. The request generator circuit is further configured to read from the memory data elements at addresses of an unprocessed one of the IFM sub-volumes and store the data elements of the unprocessed one of the IFM sub-volumes in the N line buffers. In response to a completion signal, the request generator circuit repeats the reading of an unprocessed one of the IFM sub-volumes and storing the data elements in the N line buffers.

A method disclosed herein includes dividing by a request generator circuit, a three-dimensional (3-D) input feature map (IFM) into a plurality of IFM sub-volumes based on values of N and M, and dimensions of the 3-D IFM. The request generator circuit is coupled to a plurality of N line buffers and to a memory configured for storage of the 3-D IFM. Each of the N line buffers is configured for storage of M data elements of the 3-D IFM. The method further includes reading data elements of an unprocessed one of the IFM sub-volumes from the memory by the request generator circuit, and storing the data elements of the unprocessed one of the IFM sub-volumes in the N line buffers. The method, in response to a completion signal, repeats the reading of an unprocessed one of the IFM sub-volumes and storing the data elements in the N line buffers.

Other features will be recognized from consideration of the Detailed Description and Claims, which follow.

BRIEF DESCRIPTION OF THE DRAWINGS

Various aspects and features of the circuit arrangement and method will become apparent upon review of the following detailed description and upon reference to the drawings in which.

DETAILED DESCRIPTION

Figure 1:
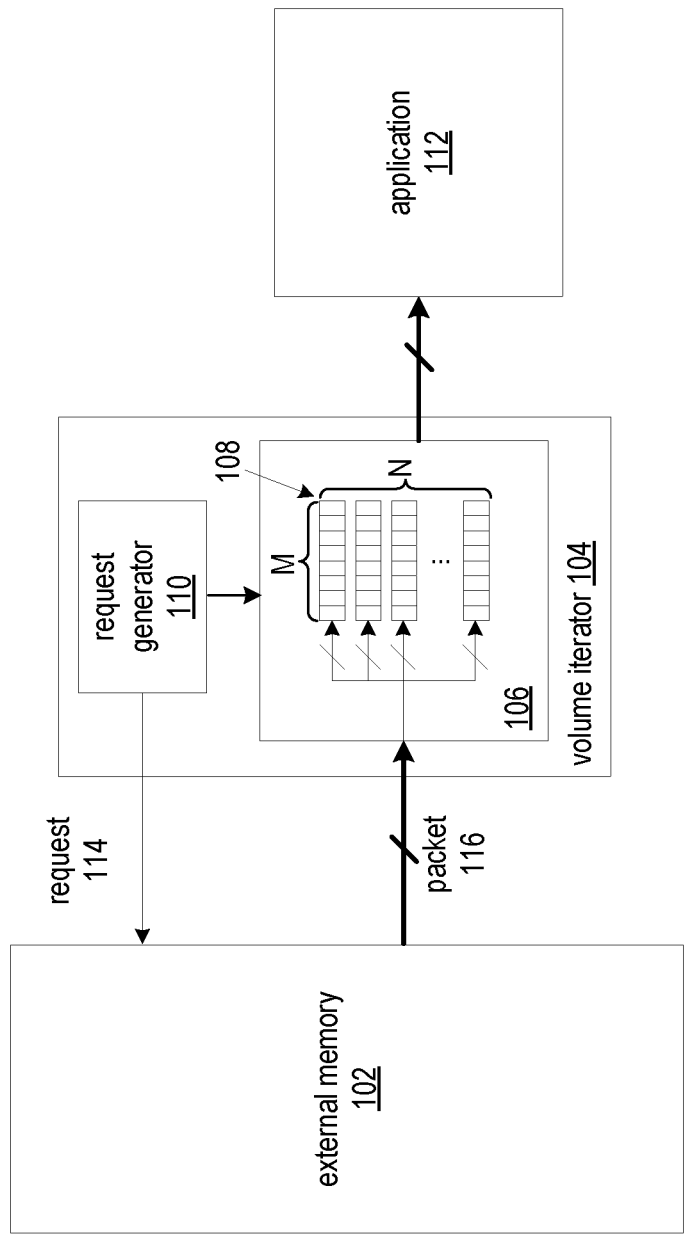
FIG. 1 shows an exemplary circuit arrangement including a request generator circuit.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

Convolution Neural Networks (CNNs) include multiple layers, where each layer is connected to a previous layer. Each layer inputs a three-dimensional (3-D) volume, hereinafter referred to as a 3-D input feature map (IFM), that includes multiple two-dimensional (2-D) planes, hereinafter referred to as 2-D IFM planes. Each 2-D IFM plane has a height and a width. The number of 2-D IFM planes of a 3-D IFM is referred to as the depth of the 3-D IFM. Each layer of a CNN outputs another 3-D volume, hereinafter referred to as a 3-D output feature map (OFM). The size of the 3-D OFM output by a layer is dependent on the size of the filter, hereinafter referred to as a kernel, applied to 3-D IFM input to the layer.

Previous approaches utilize custom CNNs for specific application domains. Each CNN incorporates multiple layers having dimensions that are customized for classifying a set of images, for example. However, using customized dimensions for different layers of a CNN increases the resource requirements for data transfers between an external memory and custom accelerators, as there is limited local storage in an FPGA on which custom accelerators can be implemented. Partitioning the problem scope into smaller tasks is difficult because of the out-of-order memory access associated with the custom dimensions.

Some previous approaches store an entire 3-D IFM in a large memory. However, those approaches may not be suitable for FPGA accelerators as FPGAs may not have sufficient local storage for an entire 3-D IFM. Previous approaches are customized for specific applications and are not scalable. Previous approaches are also limited by the size of the local storage coupled to a CNN. Small FGPAs do not have local storage FPGAs sufficient for storing an entire 3-D IFM for processing by a CNN. And even if an FPGA has sufficient storage, loading an entire 3-D IFM prior to processing increases the latency and introduces an imbalance between the bandwidth of the external memory and the bandwidth of an array of multiply-and-accumulate (MAC) circuits of a CNN.

The disclosed circuit arrangements and methods provide approaches for volume traversal for implementing high-performance CNNs. The disclosed approaches include iterating through a 3-D IFM while maintaining a balance between the size of the external memory and the bandwidth of an array of MAC circuits of a CNN. The disclosed approaches include dividing a 3-D IFM into a plurality of IFM sub-volumes based on the available local storage and the dimensions of the IFM. In contrast to previous approaches, the disclosed approaches is scalable, area-efficient, and/or adaptable to any set of CNN layers, regardless of the size of the 3-D IFM. The maximum size of an IFM sub-volume is based on the available local storage that can be assigned programmatically, thereby making the disclosed approaches device independent.

At least one implementation provides runtime programmable support for dividing any 3-D IFM. The values of the parameters for dividing a 3-D IFM can be set at runtime. Thus, the same circuit arrangement can be adapted to support multiple layers of a CNN, such as a maxpool layer and/or an average pool layer. The disclosed approaches can be used in applications other than image processing, such as those involving traversal in a one-dimensional or two-dimensional spatial domain. For example, the disclosed approaches can be used for machine learning, Deep Neural Networks (DNNs), Long-Short Term Memory (LSTM), video processing, image processing, vision applications, and General Matrix Multiplication.

For purposes of illustration, consider a local storage including a plurality of N line buffers, each of the N line buffers being configured for storage of M data elements of a 3-D IFM. There are three scenarios in which an entire 3-D IFM does not fit in the N line buffers. A first scenario is when the depth (ifm_d) of the 3-D IFM, which is also the number of 2-D IFM planes of the 3-D IFM, is greater than N, but the number of data elements of each of the 2-D IFM planes is less than or equal to M. The number of data elements of each of the 2-D IFM planes is defined by multiplying the width (ifm_w) of the 2-D IFM planes by the height (ifm_h) of the 2-D IFM planes. As used herein, "width of the 2-D IFM planes" is used interchangeably with "width of the 3-D IFM" and "height of the 2-D IFM planes" is used interchangeably with "height of the 3-D IFM." The first scenario can be expressed as ifm_d>N and ifm_w*ifm_h M. Thus, the data elements of a 2-D IFM plane will fit in one of the N line buffers, but there are more 2-D IFM planes than there are line buffers. For the first scenario, the disclosed approaches include dividing the 3-D IFM into a plurality of IFM sub-volumes, where at least one IFM sub-volume is designated to include N of the 2-D IFM planes (N of ifm_d). The disclosed approaches with respect to the first scenario are discussed further in association with FIG. 2 below.

A second scenario in which an entire 3-D IFM does not fit in the N line buffers is when the depth (ifm_d) of the 3-D IFM is less than or equal to N, but the number of data elements of each of the 2-D IFM planes is greater than M. The second scenario can be expressed as ifm_d≤N and ifm_w*ifm_h>M. Thus, there is a line buffer for each 2-D IFM plane of the 3-D IFM, but all the data elements of a 2-D IFM plane will not fit in one of the line buffers. For the second scenario, the disclosed approaches include dividing the 3-D IFM into a plurality of IFM sub-volumes, where the IFM sub-volumes are designated to include a subset of data elements of a 2-D IFM plane, based on at least one dimension of the 3-D IFM (e.g., ifm_w, ifm_h), at least one dimension of a kernel (e.g., height k_h, width k_w), and a stride of the MAC operations. The disclosed approaches with respect to the second scenario are discussed further in association with FIGS. 4-6 below.

A third scenario in which an entire 3-D IFM does not fit in the N line buffers is when the depth of the 3-D IFM (ifm_d) is greater than N and the number of data elements of each of the 2-D IFM planes is greater than M. The third scenario can be expressed as ifm_d>N and ifm_w*ifm_h>M. Thus, the data elements of a 2-D IFM plane will not fit in one of the N line buffers and there are more 2-D IFM planes than there are line buffers. For the third scenario, the disclosed approaches include dividing the 3-D IFM into a plurality of IFM sub-volumes, where the IFM sub-volumes are designated to include N of the 2-D IFM planes (N of ifm_d) and a subset of data elements of the 2-D IFM plane, based on at least one dimension of the 3-D IFM (e.g., ifm_w, ifm_h), at least one dimension of a kernel (e.g., k_h, k_w), and a stride of the MAC operations. The disclosed approaches with respect to the third scenario are discussed further in association with FIGS. 7A-7I below.

FIG. 1 shows an exemplary circuit arrangement including a request generator circuit 110. The request generator circuit 110 is coupled to a buffer circuit 106 including N line buffers 108. Each of the N line buffers 108 is configured for storage of M data elements of a 3-D IFM. The total available storage of the buffer circuit 106 is N×M. The buffer circuit 106 together with the request generator circuit 110 can be referred to as a volume iterator circuit 104.

The request generator circuit 110 generates and transmits a read request 114 for a packet of data 116. The request generator circuit 110 is discussed further in association with FIG. 9 below. The packet of data 116 includes the data elements of one of the IFM sub-volumes. The size of the packet of data 116 can be determined programmatically and is based on the available storage of the buffer circuit 106 and one or more dimension of the 3-D IFM. The lower-bound of the size of the packet of data 116 is 1*N, which corresponds to a 3-D IFM where the width (ifm_w) of the 3-D IFM is 1, the height (ifm_h) of the 3-D IFM is 1, and the depth (ifm_d)

of the 3-D IFM is less than or equal to N. The upper bound of the size of the packet of data 116 is M*N, which corresponds to a 3-D IFM where the number of data elements in each 2-D IFM plane is less than or equal to M (ifm_h*ifm_w M) and the depth (ifm_d) of the 3-D IFM is less than or equal to N. Thus, if the size of the 3-D IFM is within the lower and upper bounds, then the entire 3-D IFM can fit in the local storage. However, if the 3-D IFM is larger than the upper bound, then the disclosed approaches include dividing the 3-D IFM into IFM sub-volumes based on the one or more dimensions of the 3-D IFM that exceeds a dimension of the buffer circuit 106 as explained above.

The request 114 includes a base address and a packet length for reading the data elements of an IFM sub-volume from an external memory 102, (e.g., double data rate (DDR) random-access memory (RAM) that is coupled to the line buffers 108. The request generator circuit 110 enables storing the packet of data 116 in one of the N line buffers 108.

An application 112, such as an array of MAC circuits or a programmed instruction processor (e.g., GPU), reads the packets of data 116 from the N line buffers 108 and performs operations (e.g., MAC operations) on the data elements of the IFM sub-volumes. In at least one implementation, the line-buffers 108 are double-buffered so that a packet of data including the data elements of a next IFM sub-volume is read from the external memory 102 while a packet of data including the data elements of another IFM sub-volume is being processed (e.g., read) by the application 112.

Figure 2:
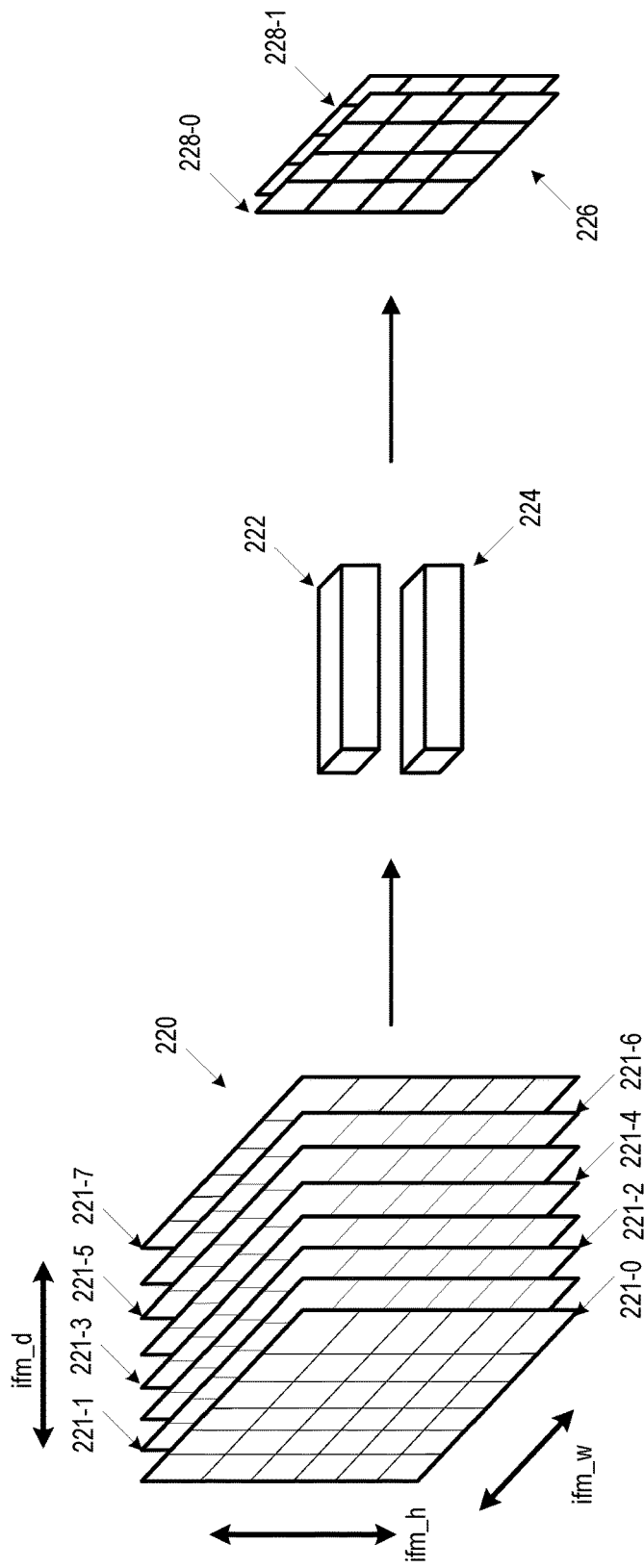
FIG. 2 shows a previous approach of a convolution layer of CNN.

FIG. 2 shows a previous approach of a convolution layer of CNN. The width (ifm_w) of the 3-D IFM 220 is 6, the height (ifm_h) of the 3-D IFM 220 is 6, and the depth (ifm_d) of the 3-D IFM 220 is 8. The width (k_w) of the kernels 222 and 224 is 3, the height (k_h) of the kernels 222 and 224 is 3, and the depth (k_d) of the kernels 222 and 224 is 8. The width (ofm_w) of the 3-D OFM 226 is 4, the height (ofm_h) of the 3-D OFM 226 is 4, and the depth (ofm_d) of the 3-D OFM 226 is 2.

Previous approaches require the entire 3-D IFM 220 to be stored locally to the array of MAC circuits. If the entire 3-D IFM 220 is too large to store the entire 3-D IFM 220 locally, then the array of MAC circuits cannot be used with the 3-D IFM 220. In contrast, the disclosed approaches divide the 3-D IFM 220 into IFM sub-volumes so that MAC operations can be performed on the data elements of an IFM sub-volume that fits in the local storage. Upon completion of these MAC operations, MAC operations can be performed on the data elements of another IFM sub-volume that fits in the local storage. Instead of customizing the circuitry of a CNN for a particular 3-D IFM, the disclosed approaches include dividing a 3-D IFM (e.g., 220) into IFM sub-volumes, each of which fit within the local storage of a CNN. Thus, no matter the size of a 3-D IFM, a single CNN can be used.

Previous approaches include storing all the data elements of the 2-D IFM planes 221-0, 221-1, 221-2, 221-3, 221-4, 221-5, 221-6, and 221-7 (collectively referred to as the 2-D IFM planes 221) in large storage local to a CNN. Then MAC operations are performed on the data elements of the 2-D IFM planes 221 and the kernel 222 to generate the 2-D OFM plane 228-0 of the 3-D OFM 226, and the 2-D IFM planes 221 and the kernel 224 to generate the 2-D OFM plane 228-1 of the 3-D OFM 226.

Figure 3:
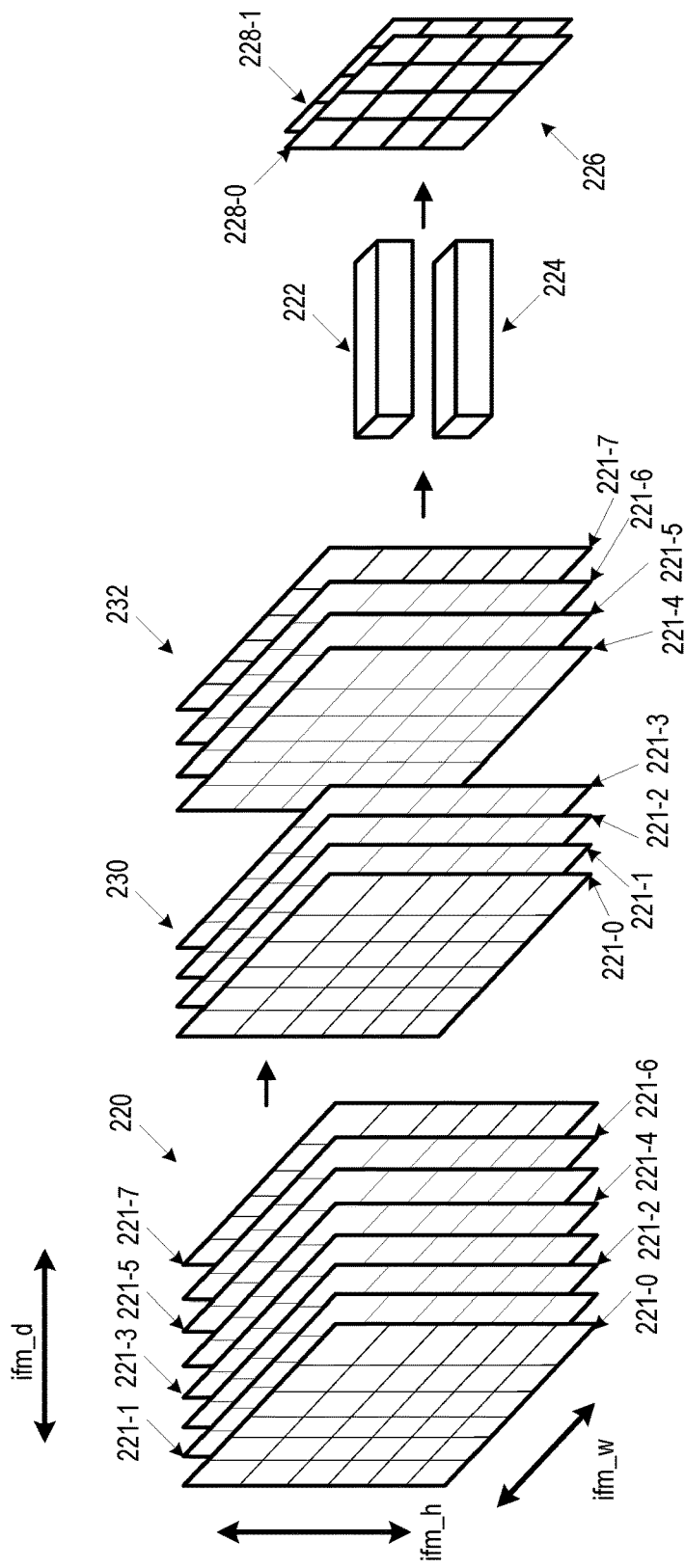
FIG. 3 shows an exemplary division of the depth of a 3-D IFM.

FIG. 3 shows an exemplary division of the depth of a 3-D IFM 220. The width (ifm_w) of the 3-D IFM 220 is 6, the height (ifm_h) of the 3-D IFM 220 is 6, and the depth (ifm_d) of the 3-D IFM 220 is 8. The width (k_w) of the kernels 222 and 224 is 3, the height (k_h) of the kernels 222 and 224 is 3, and the depth (k_d) of the kernels 222 and 224 is 8. In the example shown in FIG. 3, each of 4 line buffers 108 (N=4) is configured for storage of at least 36 data elements (M is greater or equal to 36). Each of the 2-D IFM planes 221 include 36 data elements (6*6=36). Thus, the data elements of one of the 2-D IFM planes 221 fit in one of the line buffers 108. However, the depth of the 3-D IFM 220 is larger than the number of line-buffers 108 (there are 4 more 2-D IFM planes than there are line buffers (8>4)). As a result, the entire 3-D IFM 220 does not fit in the buffer circuit 106.

In response to the depth (ifm_d) of the 3-D IFM being greater than N, the 3-D IFM 220 is divided into equally sized IFM sub-volumes so that one 2-D plane of an IFM sub-volume fits in one of the N line buffers 108. In the example shown in FIG. 3, the height (h) of each IFM sub-volume is equal to the height (ifm_h) of the 3-D IFM 220, the width (w) of each IFM sub-volume is equal to the width (ifm_w) of the 3-D IFM 220, and the depth (d) of each IFM sub-volume is equal to N. Thus, as shown in FIG. 3, the IFM sub-volumes 230 and 232 each have a width (w) of 6, a height (h) of 6, and a depth (d) of 4. The IFM sub-volume 230 includes the 2-D IFM planes 221-0, 221-1, 221-2, and 221-3, and the IFM sub-volume 232 includes the 2-D IFM planes 221-4, 221-5, 221-6, and 221-7. The number of IFM sub-volumes (depth_fragment) is defined by the depth (ifm_d) of the 3-D IFM 220 divided by N. Thus, the number of sub-volumes is 2 (8/4).

MAC operations are performed on the data elements of the IFM sub-volumes 230 and 232, and the kernel 222 to generate the 2-D OFM plane 228-0 of the 3-D OFM 226. Similarly, MAC operations are performed on the data elements of the IFM sub-volumes 230 and 232 and the kernel 224 to generate the 2-D OFM plane 228-1 of the 3-D OFM 226.

Figure 4:
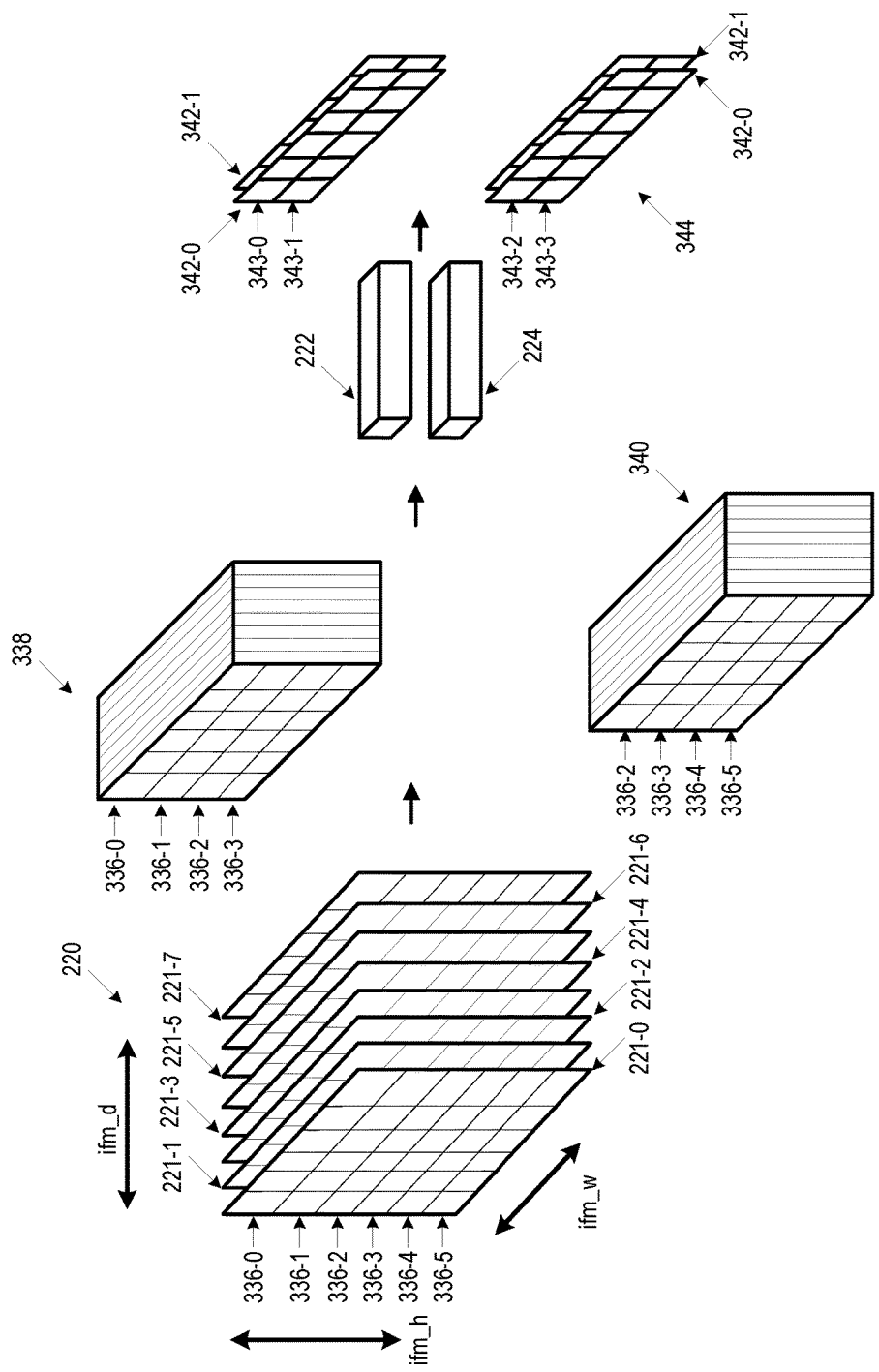
FIG. 4 shows an exemplary division of the height of a 3-D IFM.

FIG. 4 shows an exemplary division of the height of a 3-D IFM 220. The width (ifm_w) of the 3-D IFM 220 is 6, the height (ifm_h) of the 3-D IFM 220 is 6, and the depth (ifm_d) of the 3-D IFM 220 is 8. The width (k_w) of the kernels 222 and 224 is 3, the height (k_h) of the kernels 222 and 224 is 3, and the depth (k_d) of the kernels 222 and 224 is 8. In the example shown in FIG. 4, each of 8 line buffers 108 (N=8) is configured for storage of 24 data elements (M=24). Each of the 2-D IFM planes 221 include 36 data elements (6*6=36). Thus, there is a line buffer for each of the 8 2-D IFM planes. However, all the data elements of a 2-D IFM plane (e.g., 221-0) do not fit in one of the line buffers 108 (36>24). As a result, the entire 3-D IFM 220 does not fit in the buffer circuit 106.

In response to the number of data elements of the 2-D IFM planes 221 being greater than M, the 3-D IFM 220 is divided into equally sized IFM sub-volumes so that one 2-D plane of an IFM sub-volume fits in one of the N line buffers 108. In the example shown in FIG. 4, the width (w) of each IFM sub-volume is equal to the width (ifm_w) of the 3-D IFM 220, and the depth (d) of each IFM sub-volume is equal to the depth (ifm_d) of the 3-D IFM 220. The height of the 3-D IFM 220 cannot be simply cut in half because each data element (e.g., pixel) of the 3-D OFM 344 has a dependency to a subset of neighboring data elements (e.g., pixels) of the 3-D IFM 220. This dependency is based on the height (k_h) and the width (k_w) of the kernels 222 and 224 that are applied over the 2-D IFM planes 221. Due to this dependency, in order to determine the height (h) of the IFM sub-volumes, the maximum number of rows (imax) of a 2-D IFM plane (e.g., 221-0) that fits in one of the line buffers 108 is determined.

The maximum number of IFM rows (imax) is the largest integer multiple of the width (ifm_w) of the 3-D IFM 220. Thus, the maximum number of IFM rows (imax) can be expressed as imax=floor(M/ifm_w). The maximum number of rows (omax) of the 3-D OFM 344 that can be generated if the maximum number of IFM rows (imax) were stored in the line buffers 108 is determined. The variable omax is a function of the maximum number of IFM rows (imax), the height (k_h) of the kernels 222 and 224, and the stride. The variable omax can be expressed as omax=(imax−k_h)/stride+1. To find the height (h) of the sub-volumes, first the maximum number of equally-sized horizontal slices (maxNumOFMRows) is determined, such that: 1) maxNumOFMRows evenly partitions the OFM volume, and 2) the partition height is less than omax. The height (h) of the sub-volumes can then be determined as a function of omax, the height (k_h) of the kernels 222 and 224, and the stride and can be expressed as h=stride*(maxNumOFMRows−1)+k_h.

In the example of FIG. 4, the stride is 1 so that the maximum number of IFM rows (imax) is 4 (floor(24/6)) and the maximum number of OFM rows (omax) is 2 ((4−3)/1+1). Thus, the height h of the sub-volumes is 4 (1*(2−1)+3). As shown in FIG. 4, the IFM sub-volumes 338 and 340 each have a width of 6, a height of 4, and a depth of 8. The IFM sub-volume 338 includes the rows 336-0, 336-1, 336-2, and 336-3 of the 2-D IFM planes 221, and the IFM sub-volume 340 includes the rows 336-2, 336-3, 336-4, and 336-5 of the 2-D IFM planes 221. The number of IFM sub-volumes (height_fragment) is defined as the height (ofm_h) of the 3-D OFM 344 divided by the maximum number of OFM rows (omax). The number of IFM sub-volumes (height_fragment) can be expressed as ceil(ofm_h/omax). Here, the number of sub-volumes is 2 (ceil(4/2)).

MAC operations are performed on the data elements of the IFM sub-volume 338 and the kernel 222 to generate the rows 343-0 and 343-1 of the 2-D OFM plane 342-0 of the 3-D OFM 344, and MAC operations are performed on the data elements of the IFM sub-volume 340 and the kernel 222 to generate the rows 343-2 and 343-3 of the 2-D OFM plane 342-0 of the 3-D OFM 344. Similarly, MAC operations are performed on the data elements of the IFM sub-volume 338 and the kernel 224 to generate the rows 343-0 and 343-1 the 2-D OFM plane 342-1 of the 3-D OFM 344 and MAC operations are performed on the data elements of the IFM sub-volume 340 and the kernel 224 to generate the rows 343-2 and 343-3 of the 2-D OFM plane 342-1 of the 3-D OFM 344.

Figure 5A:
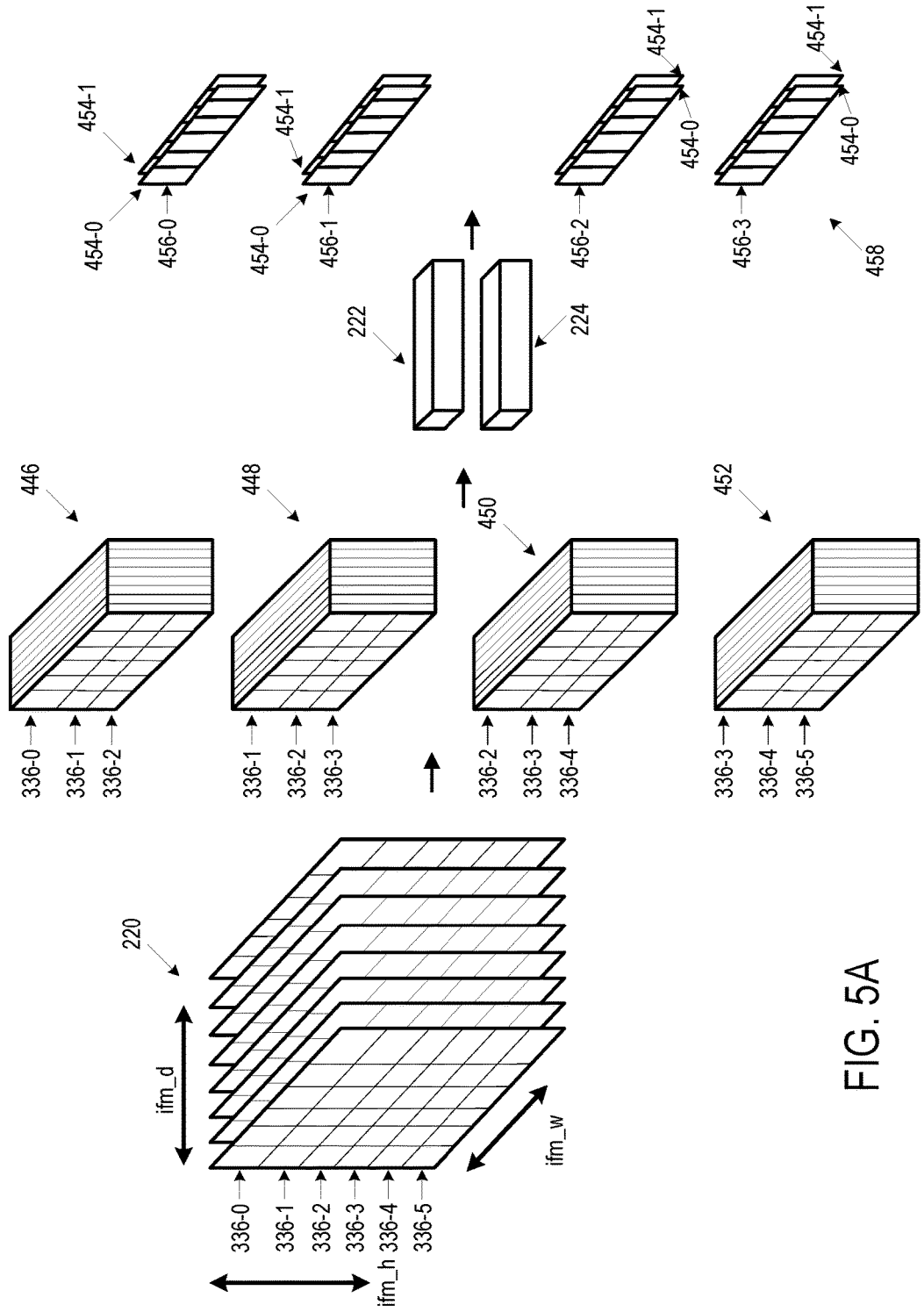
FIG. 5A shows an exemplary division the height of a 3-D IFM.

FIG. 5A shows an exemplary division the height of a 3-D IFM 220. The width (ifm_w) of the 3-D IFM 220 is 6, the height (ifm_h) of the 3-D IFM 220 is 6, and the depth (ifm_d) of the 3-D IFM 220 is 8. The width (k_w) of the kernels 222 and 224 is 3, the height (k_h) of the kernels 222 and 224 is 3, and the depth (k_d) of the kernels 222 and 224 is 8. In the example shown in FIG. 4, each of 8 line buffers 108 (N=8) is configured for storage of 24 data elements (M=18). Each of the 2-D IFM planes 221 include 36 data elements (6*6=36). Thus, there is a line buffer for each of the 8 2-D IFM planes. However, all the data elements of a 2-D IFM plane (e.g., 221-0) do not fit in one of the line buffers 108 (36>18). As a result, the entire 3-D IFM 220 does not fit in the buffer circuit 106. The determination of the height (h) of the sub-volumes is the same for the example shown in FIG. 5A as the example shown in FIG. 4, except that M=18.

In the example of FIG. 5A, the stride is 1 so that the maximum number of IFM rows (imax) is 3 (floor(18/6)) and the maximum number of OFM rows (omax) is 1 ((3−3)/1+1). Thus, the height h of the sub-volumes is 3 (1*(1−1)+3). As shown in FIG. 5A, the IFM sub-volumes 446, 448, 450, and 452 each have a width of 6, a height of 3, and a depth of 8. The number of IFM sub-volumes (height_fragment) is 4 (ceil(4/1)).

Figure 5B:
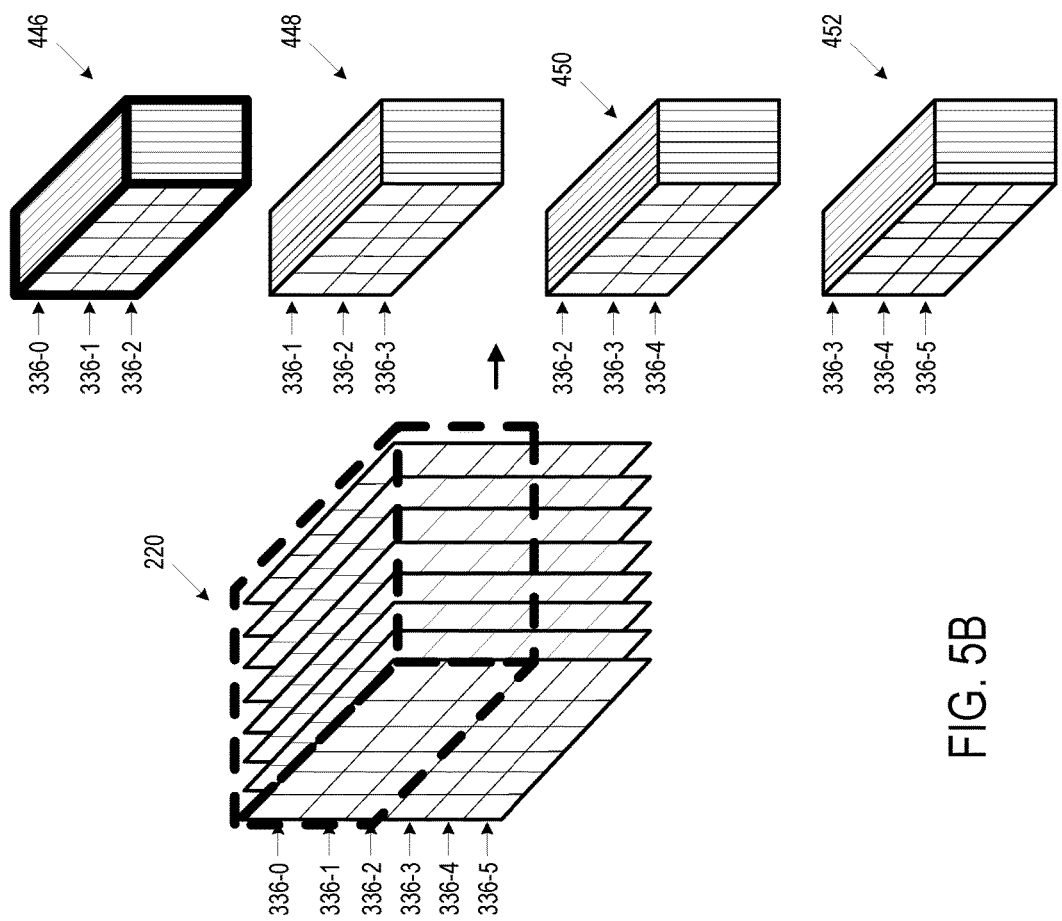
FIGS. 5B-5E show the correspondence between the 3-D IFM and the IFM sub-volumes of FIG. 5A.

FIGS. 5B-5E show the correspondence between the 3-D IFM 220 and the IFM sub-volumes 446, 448, 450, and 452. As shown in FIG. 5B, the IFM sub-volume 446 includes the rows 336-0, 336-1, and 336-2 of the 2-D IFM planes 221. MAC operations are performed on the data elements of the IFM sub-volume 446 and the kernel 222 to generate the row 456-0 of the 2-D OFM plane 454-0 of the 3-D OFM 458 shown in FIG. 5A. Similarly, MAC operations are performed on the data elements of the IFM sub-volume 446 and the kernel 224 to generate the row 456-0 of the 2-D OFM plane 454-1 of the 3-D OFM 458 shown in FIG. 5A.

Figure 5C:
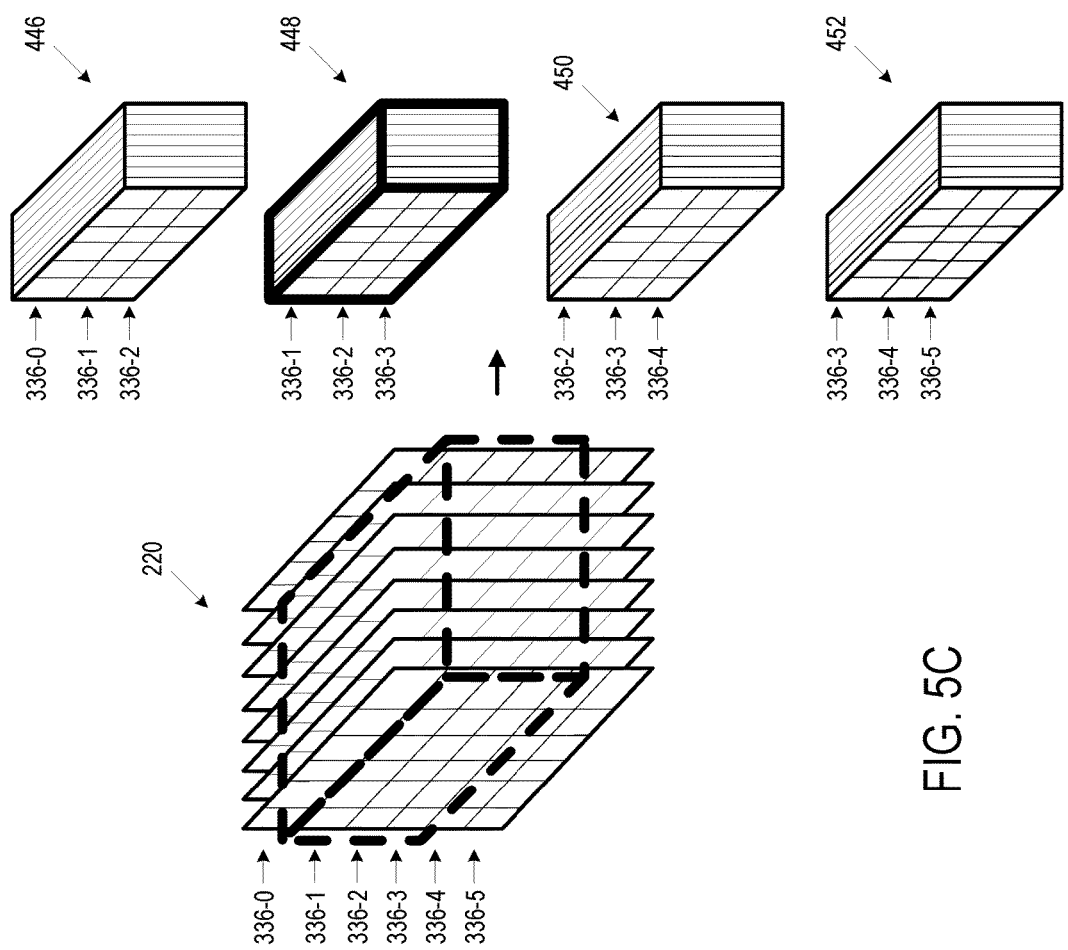

As shown in FIG. 5C, the IFM sub-volume 448 includes the rows 336-1, 336-2, and 336-3 of the 2-D IFM planes 221. MAC operations are performed on the data elements of the IFM sub-volume 448 and the kernel 222 to generate the row 456-1 of the 2-D OFM plane 454-0 of the 3-D OFM 458 shown in FIG. 5A. Similarly, MAC operations are performed on the data elements of the IFM sub-volume 448 and the kernel 224 to generate the row 456-1 of the 2-D OFM plane 454-1 of the 3-D OFM 458 shown in FIG. 5A.

Figure 5D:
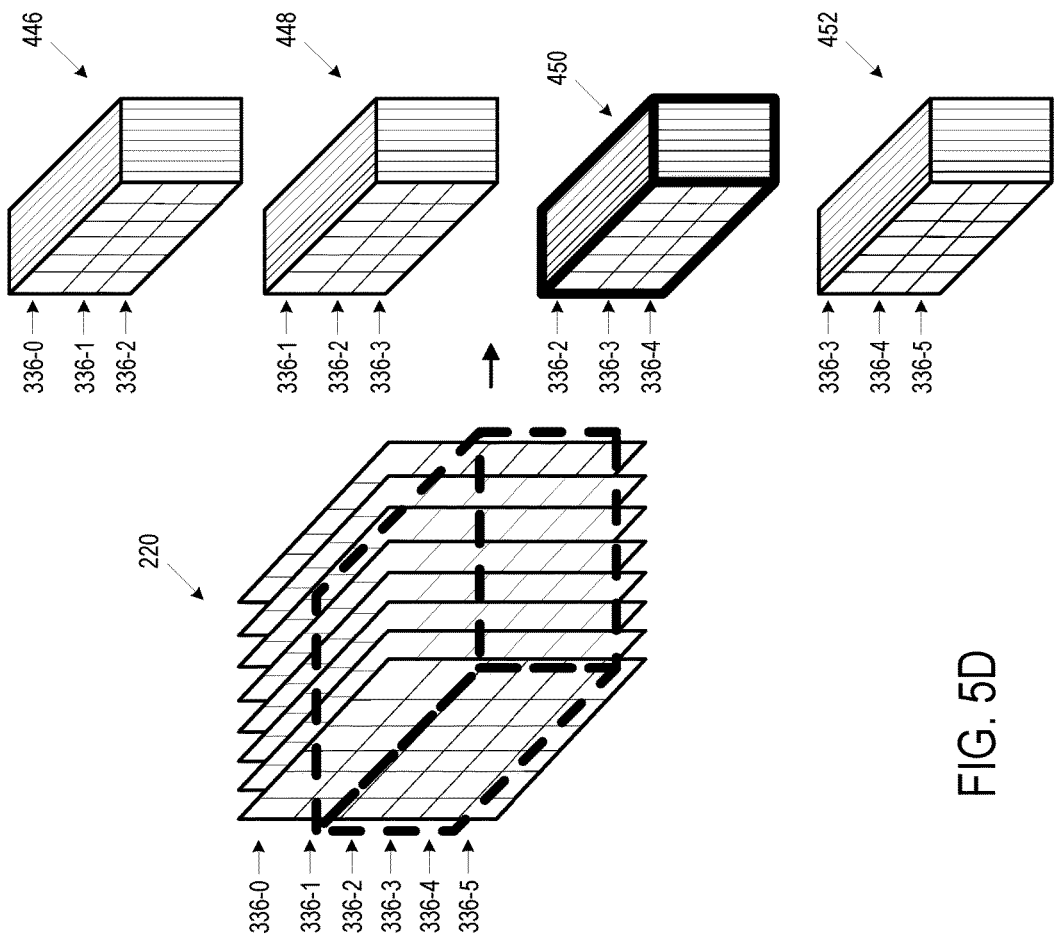

As shown in FIG. 5D, the IFM sub-volume 450 includes the rows 336-2, 336-3, and 336-4 of the 2-D IFM planes 221. MAC operations are performed on the data elements of the IFM sub-volume 450 and the kernel 222 to generate the row 456-2 of the 2-D OFM plane 454-0 of the 3-D OFM 458 shown in FIG. 5A. Similarly, MAC operations are performed on the data elements of the IFM sub-volume 450 and the kernel 224 to generate the row 456-2 of the 2-D OFM plane 454-1 of the 3-D OFM 458 shown in FIG. 5A.

Figure 5E:
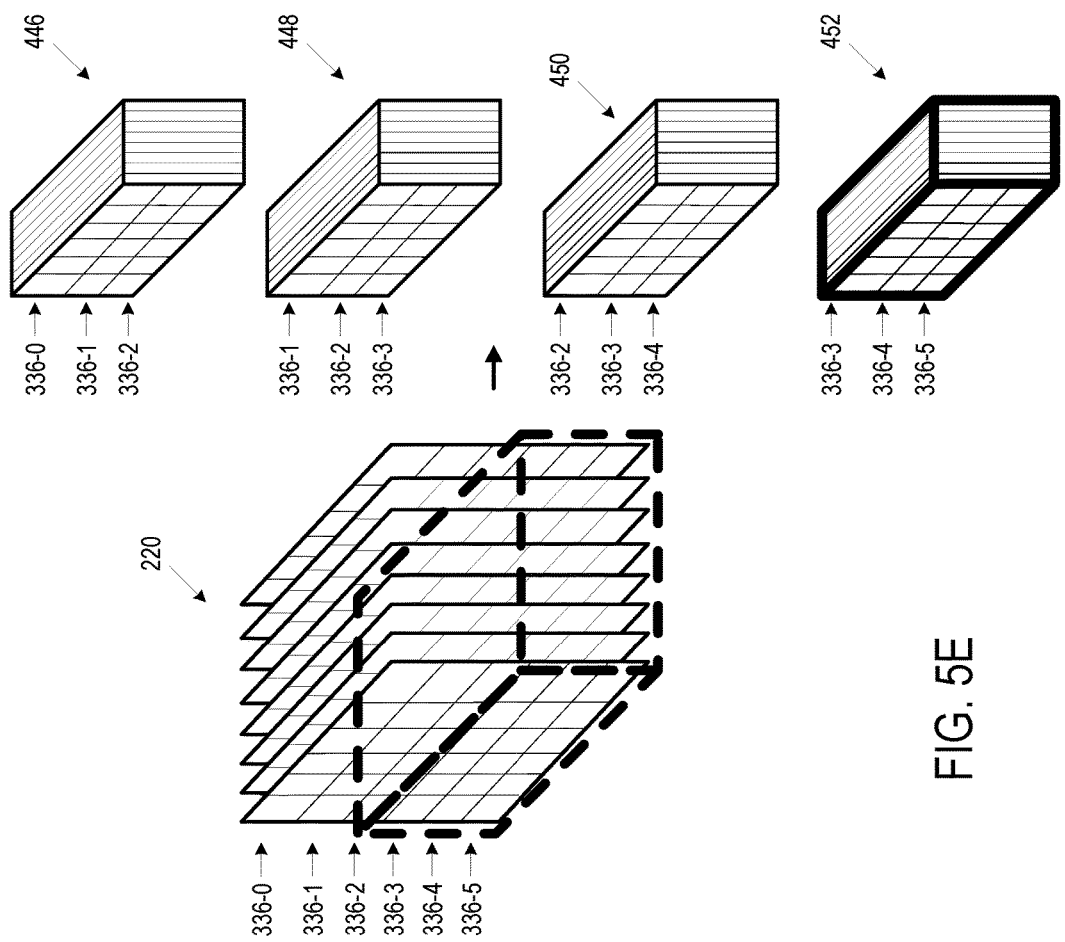

As shown in FIG. 5E, the IFM sub-volume 452 includes the rows 336-3, 336-4, and 336-5 of the 2-D IFM planes 221. MAC operations are performed on the data elements of the IFM sub-volume 452 and the kernel 222 to generate the row 456-3 of the 2-D OFM plane 454-0 of the 3-D OFM 458 shown in FIG. 5A. Similarly, MAC operations are performed on the data elements of the IFM sub-volume 452 and the kernel 224 to generate the row 456-3 of the 2-D OFM plane 454-1 of the 3-D OFM 458 shown in FIG. 5A.

Figure 6:
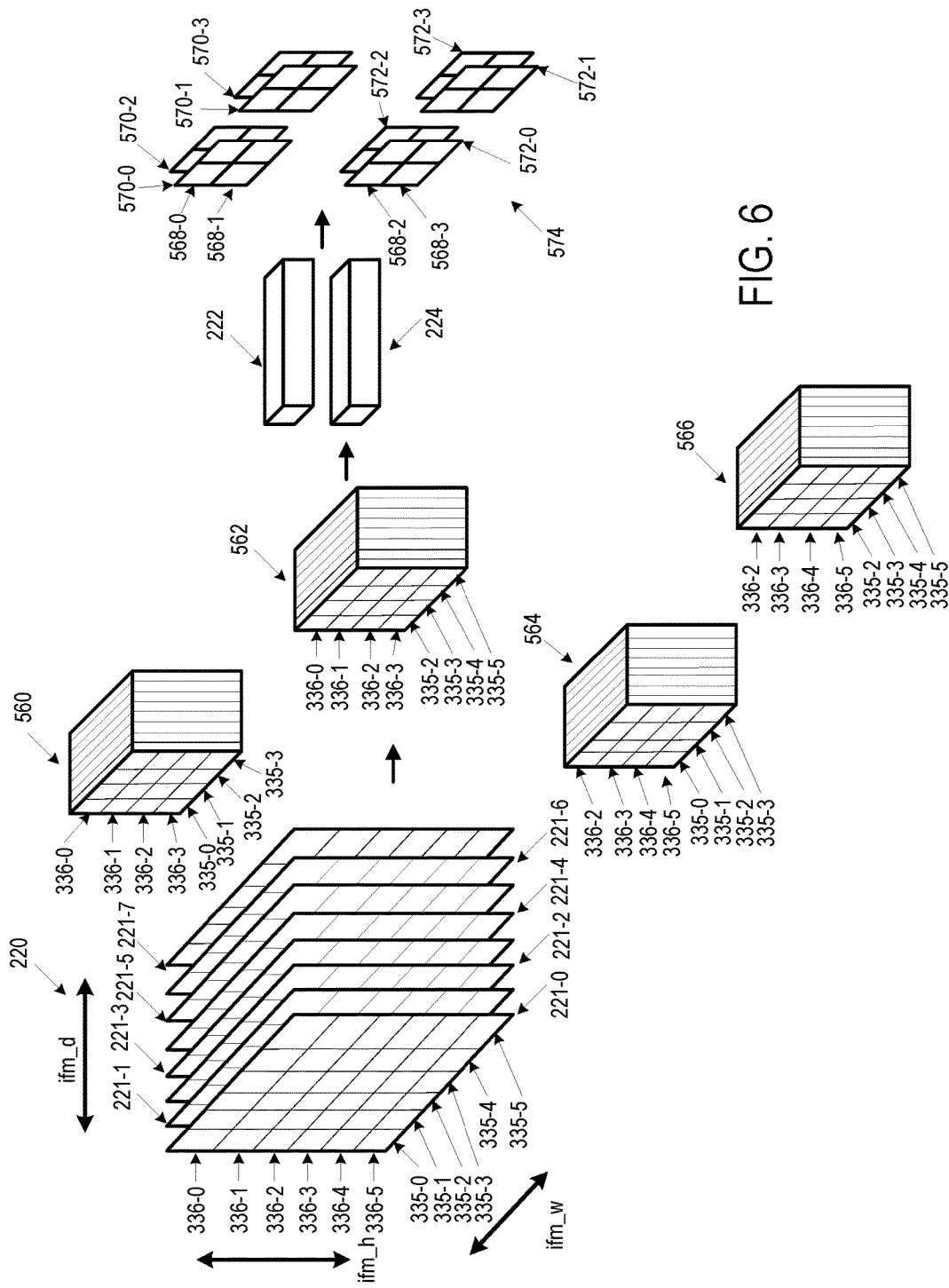
FIG. 6 shows an exemplary division the depth and height of a 3-D IFM.

FIG. 6 shows an exemplary division of the depth and height of a 3-D IFM 220, for M less than ifm_w*k_h. For example, if ifm_w=6, k_h=3, and M=17, then ifm_w*k_h>M. The width (ifm_w) of the 3-D IFM 220 is 6, the height (ifm_h) of the 3-D IFM 220 is 6, and the depth (ifm_d) of the 3-D IFM 220 is 8. In the example shown in FIG. 6, N is 8 and M is 17 so that the product of the width of the 3-D IFM 220 and the height of the kernels 222 and 224 is greater than M (ifm_w*k_h>M; 6*3>17).

In response to the number of data elements of the 2-D IFM planes 221 being greater than M and the product of the width (ifm_w) of the 3-D IFM 220 and the height (k_h) of the kernels 222 and 224 being greater than M, the 3-D IFM 220 is divided into equally sized IFM sub-volumes so that one 2-D plane of an IFM sub-volumes fits in one of the N line buffers 108. In the example shown in FIG. 6, the depth (d) of each IFM sub-volume is equal to the depth (ifm_d) of the 3-D IFM 220, but each IFM sub-volume is designated a subset of the data elements of each of the 2-D IFM planes 221 associated with a subset of the rows 336-0, 336-1, 336-2, 336-3, 336-4, and 336-5 (collectively referred to as the rows 336) and the columns 335-0, 335-1, 335-2, 335-3, 335-4, and 335-5 (collectively referred to as the columns 335) of the 3-D IFM 220.

The height h of each of the IFM sub-volumes 560, 562, 564, and 566 is determined as explained above in association with FIG. 4. The IFM sub-volumes 560 and 562 include the rows 336-0, 336-1, 336-2, and 336-3 of the 2-D IFM planes 221, and the IFM sub-volumes 564 and 566 include the rows 336-2, 336-3, 336-4, and 336-5 of the 2-D IFM planes 221.

MAC operations are performed on the data elements of the IFM sub-volumes 560 and 562 and the kernel 222 to generate the rows 568-0 and 568-1 of the 2-D OFM planes 570-0 and 570-1 of the 3-D OFM 574; and MAC operations are performed on the data elements of the IFM sub-volumes 564 and 566 and the kernel 222 to generate the rows 568-2 and 568-3 of the 2-D OFM planes 572-0 and 572-1 of the 3-D OFM 574. Similarly, MAC operations are performed on the data elements of the IFM sub-volumes 560 and 562 and the kernel 224 to generate the rows 568-0 and 568-1 of the 2-D OFM planes 570-2 and 570-3 of the 3-D OFM 574; and MAC operations are performed on the data elements of the IFM sub-volumes 564 and 566 and the kernel 224 to generate the rows 568-2 and 568-3 of the 2-D OFM planes 572-2 and 572-3 of the 3-D OFM 574.

Figure 7A:
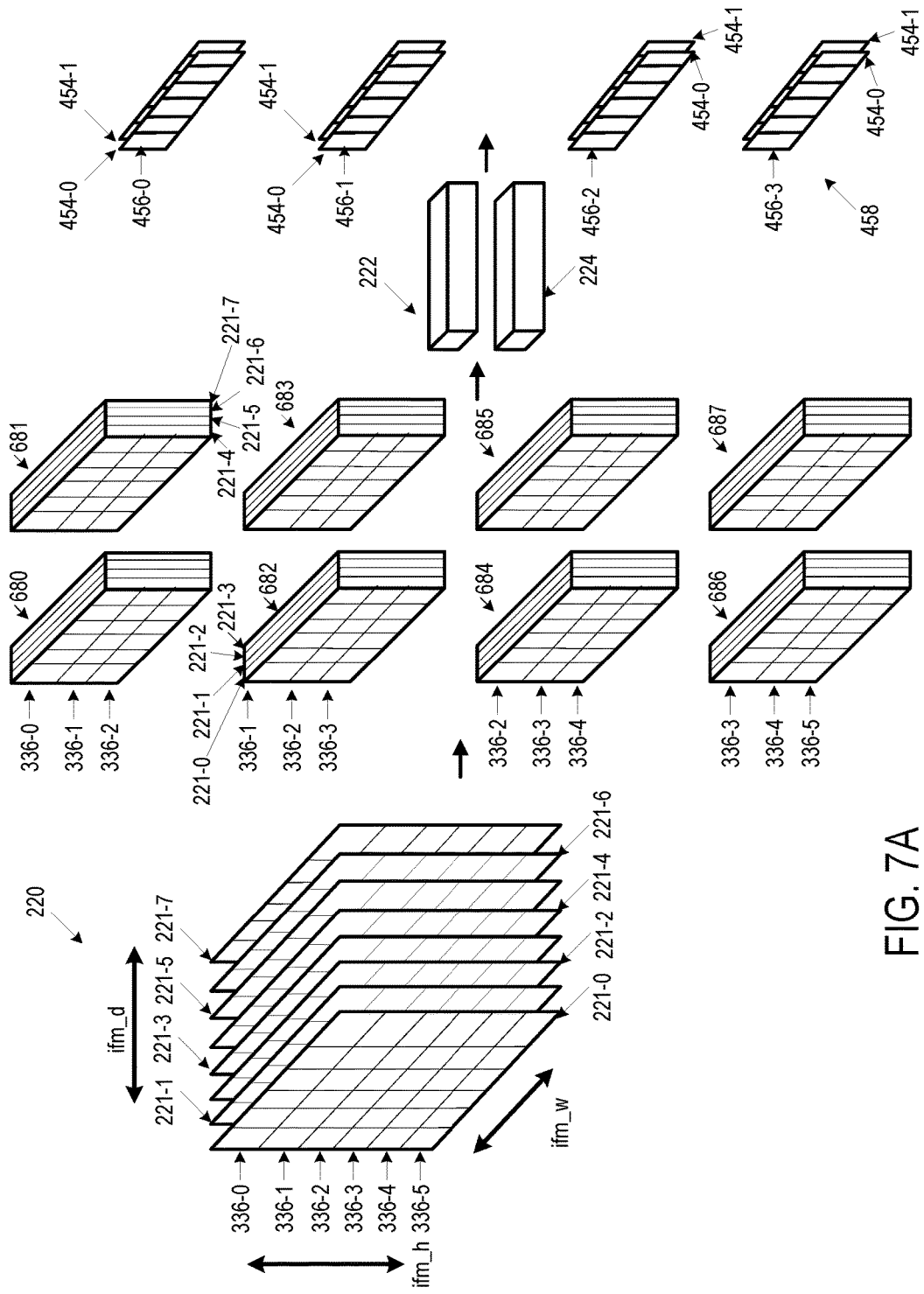
FIG. 7A shows an exemplary division the depth and height of a 3-D IFM.

FIG. 7A shows an exemplary division the depth and height of a 3-D IFM 220. The width (ifm_w) of the 3-D IFM 220 is 6, the height (ifm_h) of the 3-D IFM 220 is 6, and the depth (ifm_d) of the 3-D IFM 220 is 8. The width (k_w) of the kernels 222 and 224 is 3, the height (k_h) of the kernels 222 and 224 is 3, and the depth (k_d) of the kernels 222 and 224 is 8. In the example shown in FIG. 7A, each of 4 line buffers 108 (N=4) is configured for storage of 18 data elements (M=18). Each of the 2-D IFM planes 221 include 36 data elements (6*6=36). Thus, the depth of the 3-D IFM 220 is larger than the number of line-buffers 108 (there are 4 more 2-D IFM planes than there are line buffers (8>4)), and all the data elements of a 2-D IFM plane (e.g., 221-0) do not fit in one of the line buffers 108 (36>18). As a result, the entire 3-D IFM 220 does not fit in the buffer circuit 106.

In response to the number of data elements of the 2-D IFM planes 221 being greater than M, the 3-D IFM 220 is divided into equally sized IFM sub-volumes so that one 2-D plane of individual IFM sub-volumes fit in one of the N line buffers 108. In the example shown in FIG. 7A, the width (w) of each IFM sub-volume is equal to the width (ifm_w) of the 3-D IFM 220. The height of the 3-D IFM 220 cannot be simply cut in half because each data element (e.g., pixel) of the 3-D OFM 344 has a dependency to a subset of neighboring data elements (e.g., pixels) of the 3-D IFM 220. This dependency is based on the height (k_h) and the width (k_w) of the kernels 222 and 224 that are applied over the 2-D IFM planes 221. Due to this dependency, in order to determine the height (h) of the IFM sub-volumes, the maximum number of rows (imax) of a 2-D IFM plane (e.g., 221-0) that fits in one of the line buffers 108 is determined as explained above in association with FIGS. 4 and 5A.

In the example of FIG. 7A, the stride is 1 so that the maximum number of IFM rows (imax) is 3 (floor(18/6)) and the maximum number of OFM rows (omax) is 1 ((3−3)/1+1). Thus, the height (h) of the sub-volumes is 3 (1*(1−1)+3). The IFM sub-volumes 680, 681, 682, 683, 684, 685, 686, and 687 each have a width of 6 and a depth of 8.

Because the depth (ifm_d) of the 3-D IFM 220 is greater than N, each IFM sub-volume is designated to include N of the 2-D IFM planes 221 as explained above in association with FIG. 3. In the example shown in FIG. 7A, each of the IFM sub-volumes include a subset of the data elements of 4 of the 8 IFM planes 221. As shown in FIG. 7A, the height, width, and depth of each of the IFM sub-volumes 680, 681, 682, 683, 684, 685, 686, and 687 is 3, 6, and 4, respectively. The number of IFM height fragments (height_fragment) is 4 (ceil(4/1)). The number of depth fragments (depth_fragment) is 2. As a result, the total number of IFM sub-volumes is 8 (4*2).

Figure 7B:
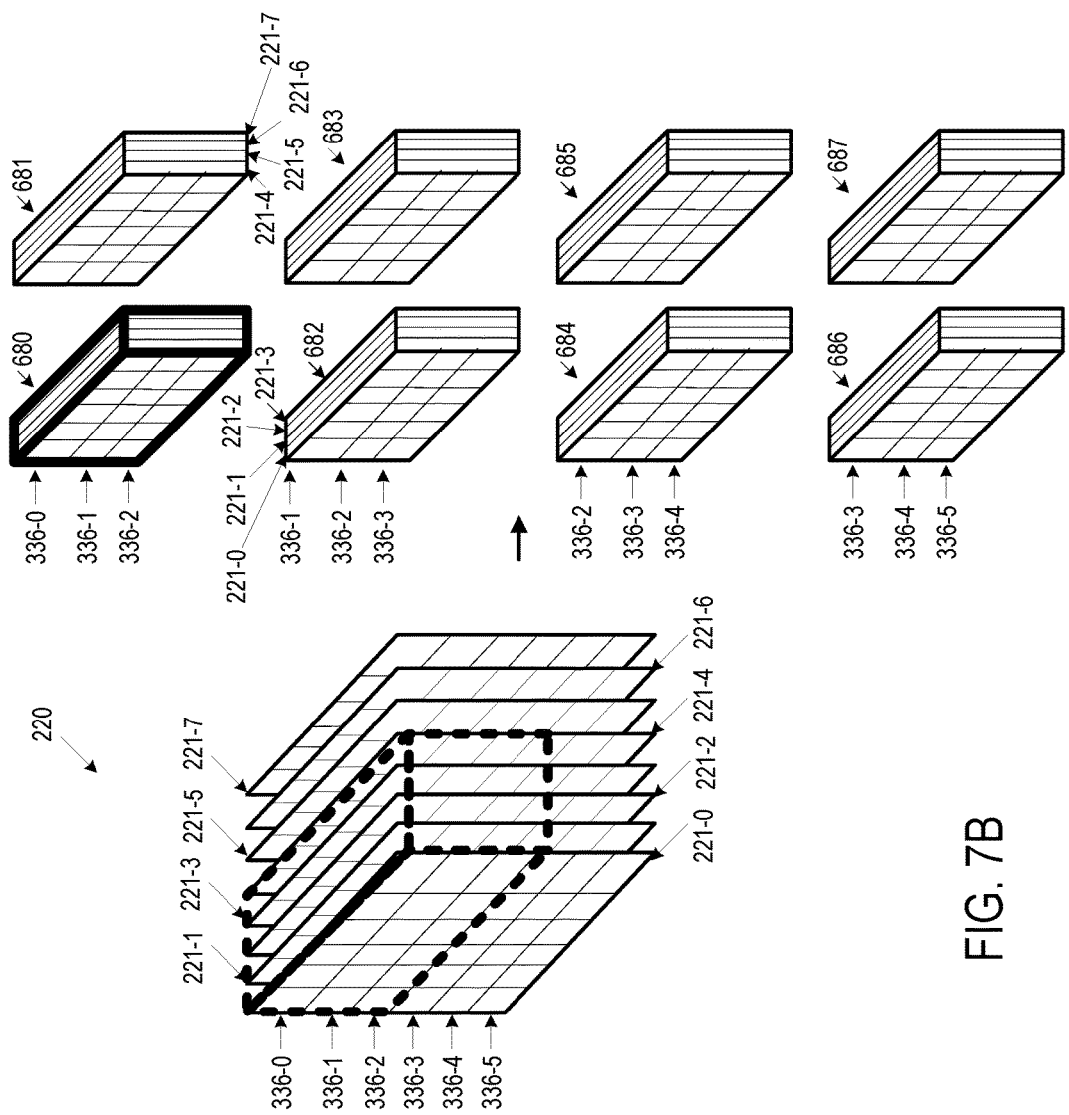
FIGS. 7B-7I show the correspondence between the 3-D IFM and the IFM sub-volumes of FIG. 7A.

FIGS. 7B-7I show the correspondence between the 3-D IFM 220 and the IFM sub-volumes 680, 681, 682, 683, 684, 685, 686, and 687. As shown in FIG. 7B, the IFM sub-volume 680 includes the rows 336-0, 336-1, and 336-2 of the 2-D IFM planes 221-0, 221-1, 221-2, and 221-3. MAC operations are performed on the data elements of the IFM sub-volume 680 and the kernel 222 to generate the row 456-0 of the 2-D OFM plane 454-0 of the 3-D OFM 458 shown in FIG. 7A. Similarly, MAC operations are performed on the data elements of the IFM sub-volume 680 and the kernel 224 to generate the row 456-0 of the 2-D OFM plane 454-1 of the 3-D OFM 458 shown in FIG. 7A.

Figure 7C:
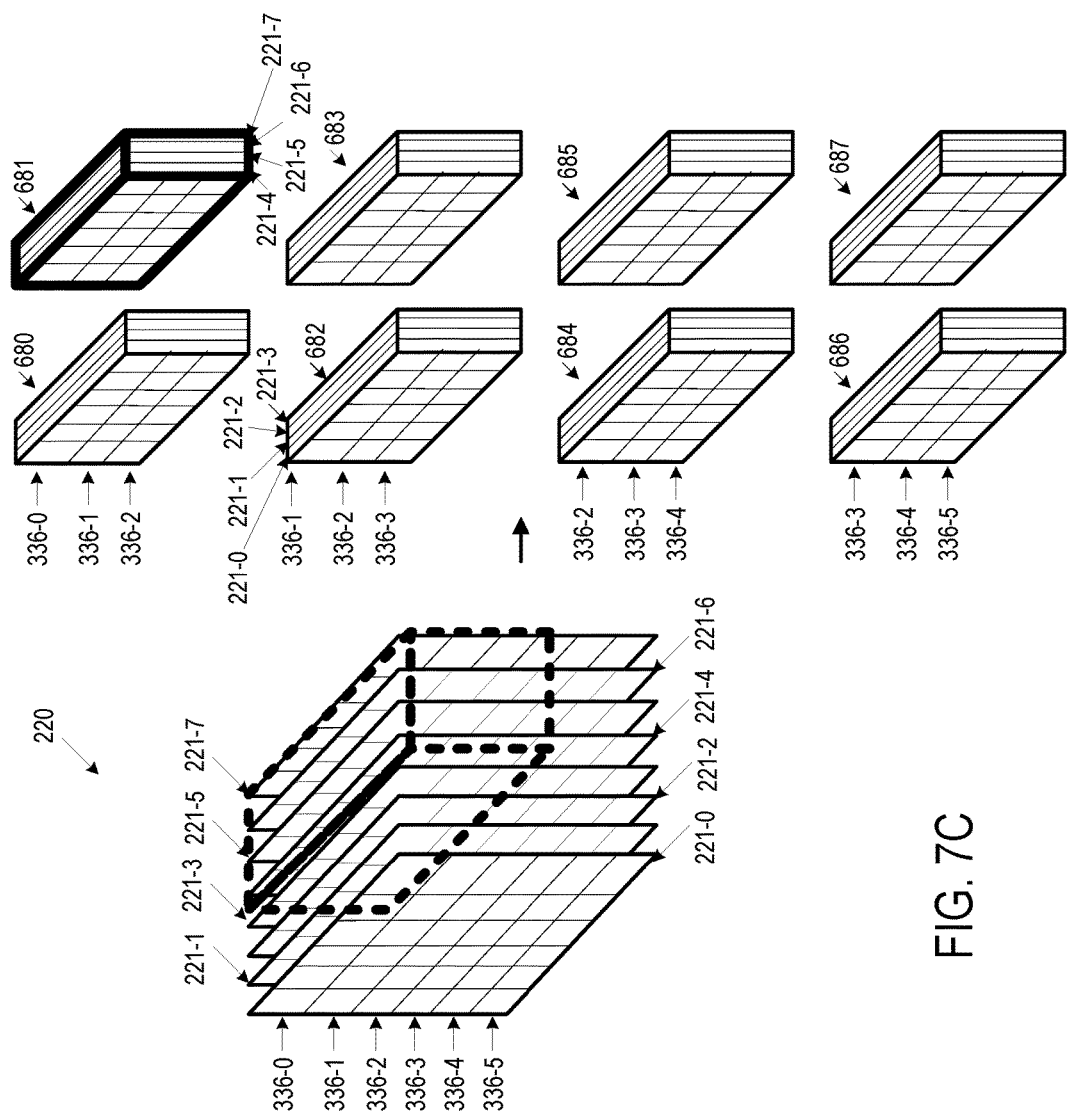

As shown in FIG. 7C, the IFM sub-volume 681 includes the rows 336-0, 336-1, and 336-2 of the 2-D IFM planes 221-4, 221-5, 221-6, and 221-7. MAC operations are performed on the data elements of the IFM sub-volume 681 and the kernel 222 to generate the row 456-0 of the 2-D OFM plane 454-0 of the 3-D OFM 458 shown in FIG. 7A. Similarly, MAC operations are performed on the data elements of the IFM sub-volume 681 and the kernel 224 to generate the row 456-0 of the 2-D OFM plane 454-1 of the 3-D OFM 458 shown in FIG. 7A.

Figure 7D:
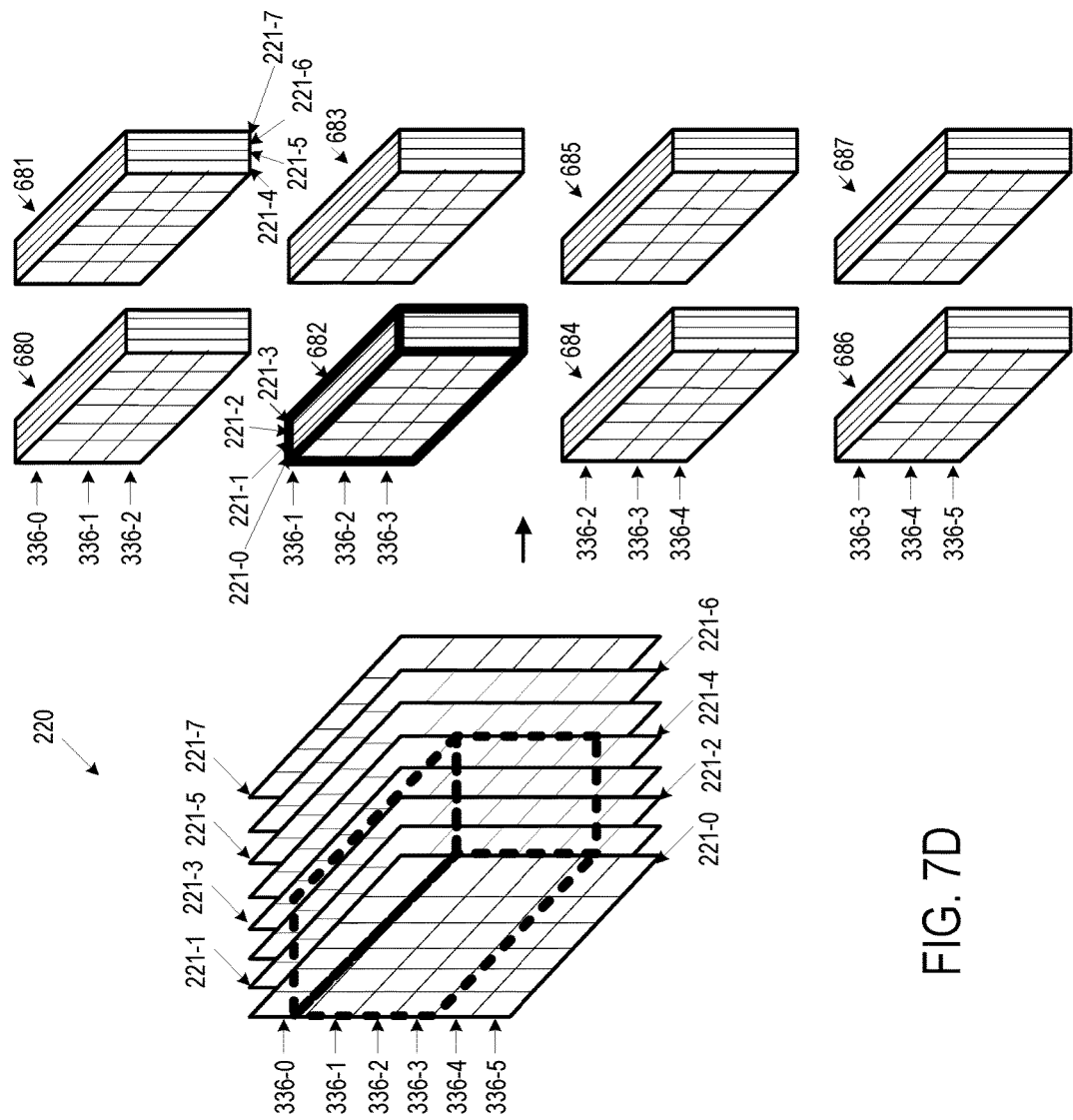

As shown in FIG. 7D, the IFM sub-volume 682 includes the rows 336-1, 336-2, and 336-3 of the 2-D IFM planes 221-0, 221-1, 221-2, and 221-3. MAC operations are performed on the data elements of the IFM sub-volume 682 and the kernel 222 to generate the row 456-1 of the 2-D OFM plane 454-0 of the 3-D OFM 458 shown in FIG. 7A. Similarly, MAC operations are performed on the data elements of the IFM sub-volume 682 and the kernel 224 to generate the row 456-1 of the 2-D OFM plane 454-1 of the 3-D OFM 458 shown in FIG. 7A.

Figure 7E:
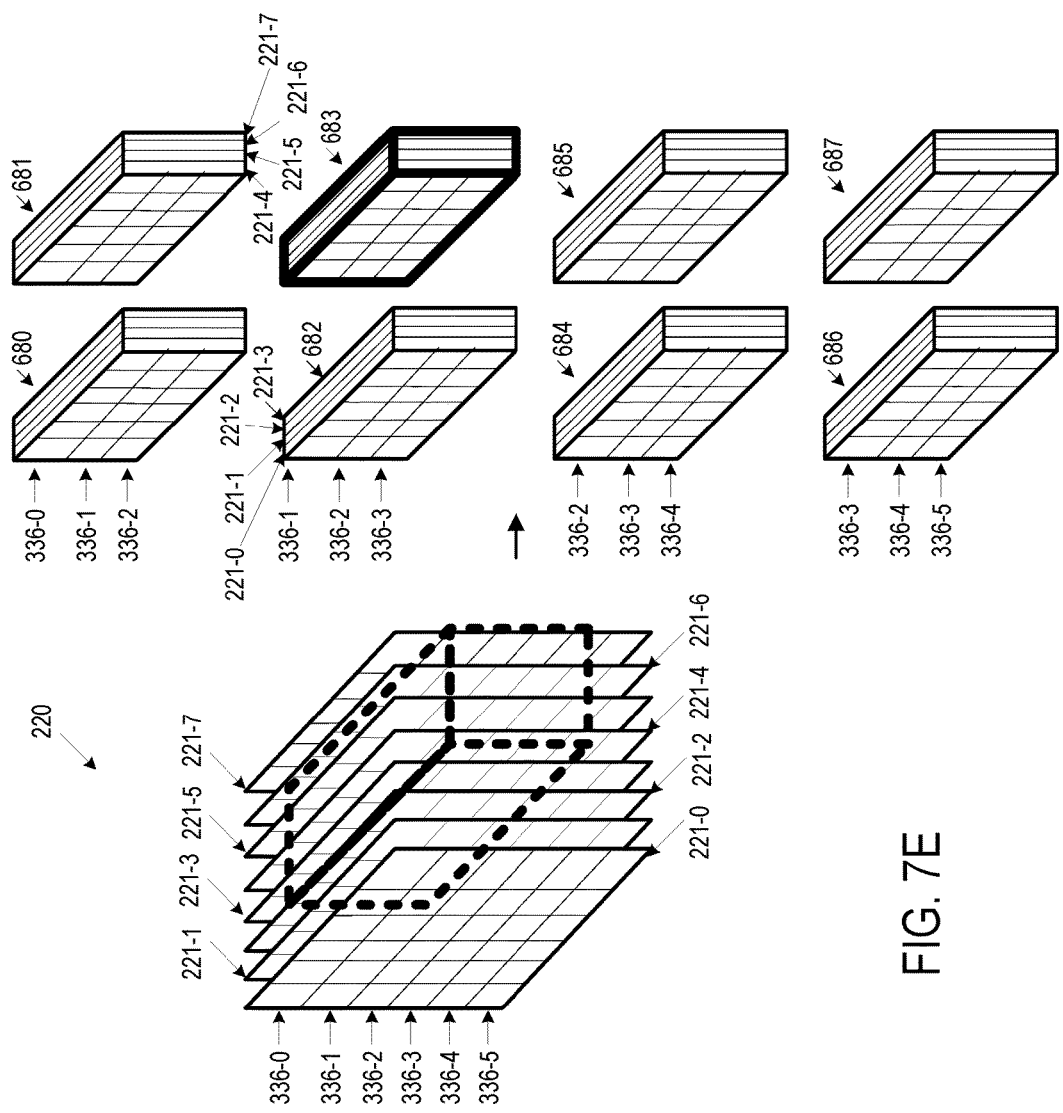

As shown in FIG. 7E, the IFM sub-volume 683 includes the rows 336-1, 336-2, and 336-3 of the 2-D IFM planes 221-4, 221-5, 221-6, and 221-7. MAC operations are performed on the data elements of the IFM sub-volume 683 and the kernel 222 to generate the row 456-1 of the 2-D OFM plane 454-0 of the 3-D OFM 458 shown in FIG. 7A. Similarly, MAC operations are performed on the data elements of the IFM sub-volume 683 and the kernel 224 to generate the row 456-1 of the 2-D OFM plane 454-1 of the 3-D OFM 458 shown in FIG. 7A.

Figure 7F:
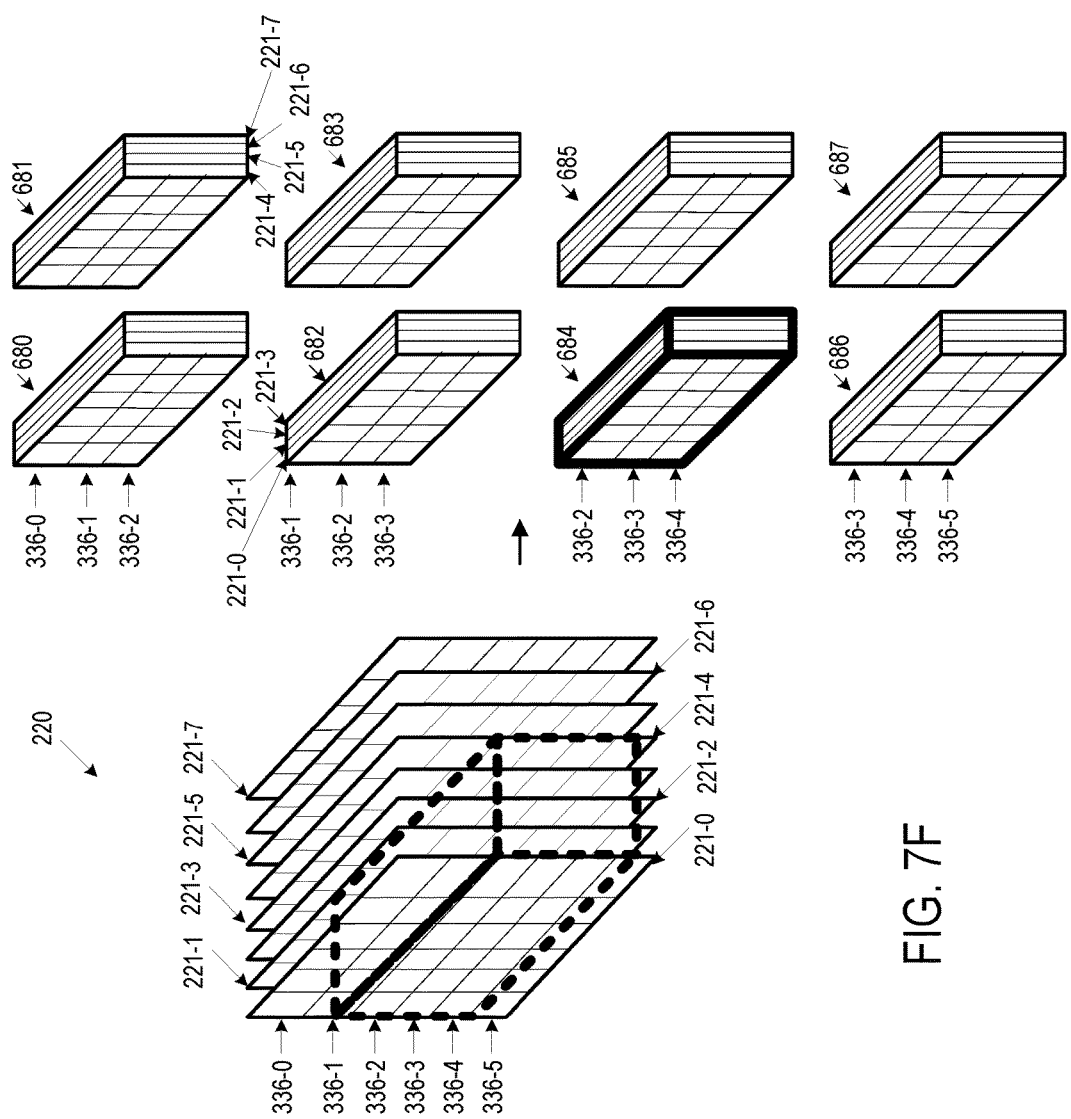

As shown in FIG. 7F, the IFM sub-volume 684 includes the rows 336-2, 336-3, and 336-4 of the 2-D IFM planes 221-0, 221-1, 221-2, and 221-3. MAC operations are performed on the data elements of the IFM sub-volume 684 and the kernel 222 to generate the row 456-2 of the 2-D OFM plane 454-0 of the 3-D OFM 458 shown in FIG. 7A. Similarly, MAC operations are performed on the data elements of the IFM sub-volume 684 and the kernel 224 to generate the row 456-2 of the 2-D OFM plane 454-1 of the 3-D OFM 458 shown in FIG. 7A.

Figure 7G:
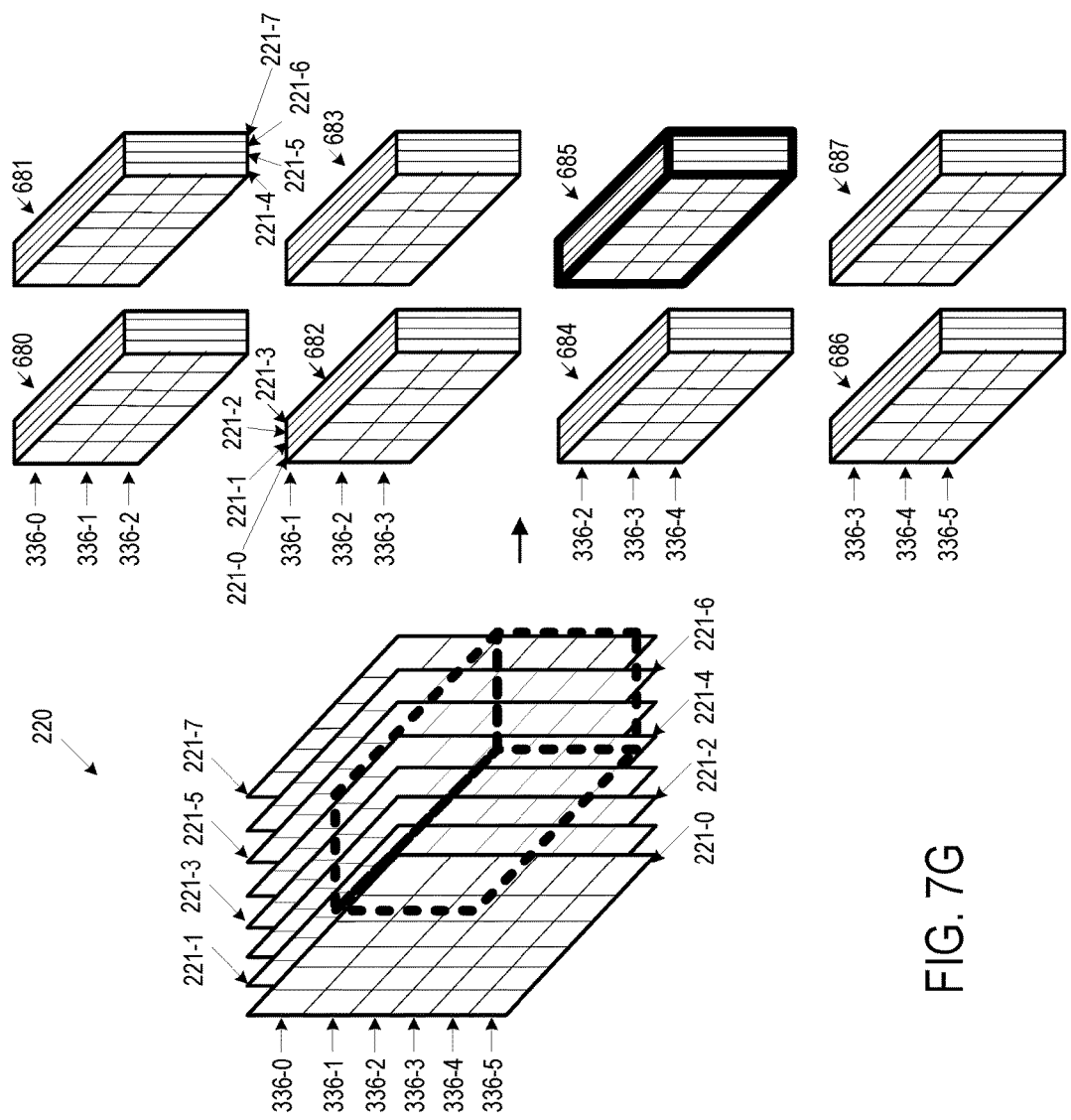

As shown in FIG. 7G, the IFM sub-volume 685 includes the rows 336-2, 336-3, and 336-4 of the 2-D IFM planes 221-4, 221-5, 221-6, and 221-7. MAC operations are performed on the data elements of the IFM sub-volume 685 and the kernel 222 to generate the row 456-2 of the 2-D OFM plane 454-0 of the 3-D OFM 458 shown in FIG. 7A. Similarly, MAC operations are performed on the data elements of the IFM sub-volume 685 and the kernel 224 to generate the row 456-2 of the 2-D OFM plane 454-1 of the 3-D OFM 458 shown in FIG. 7A.

Figure 7H:
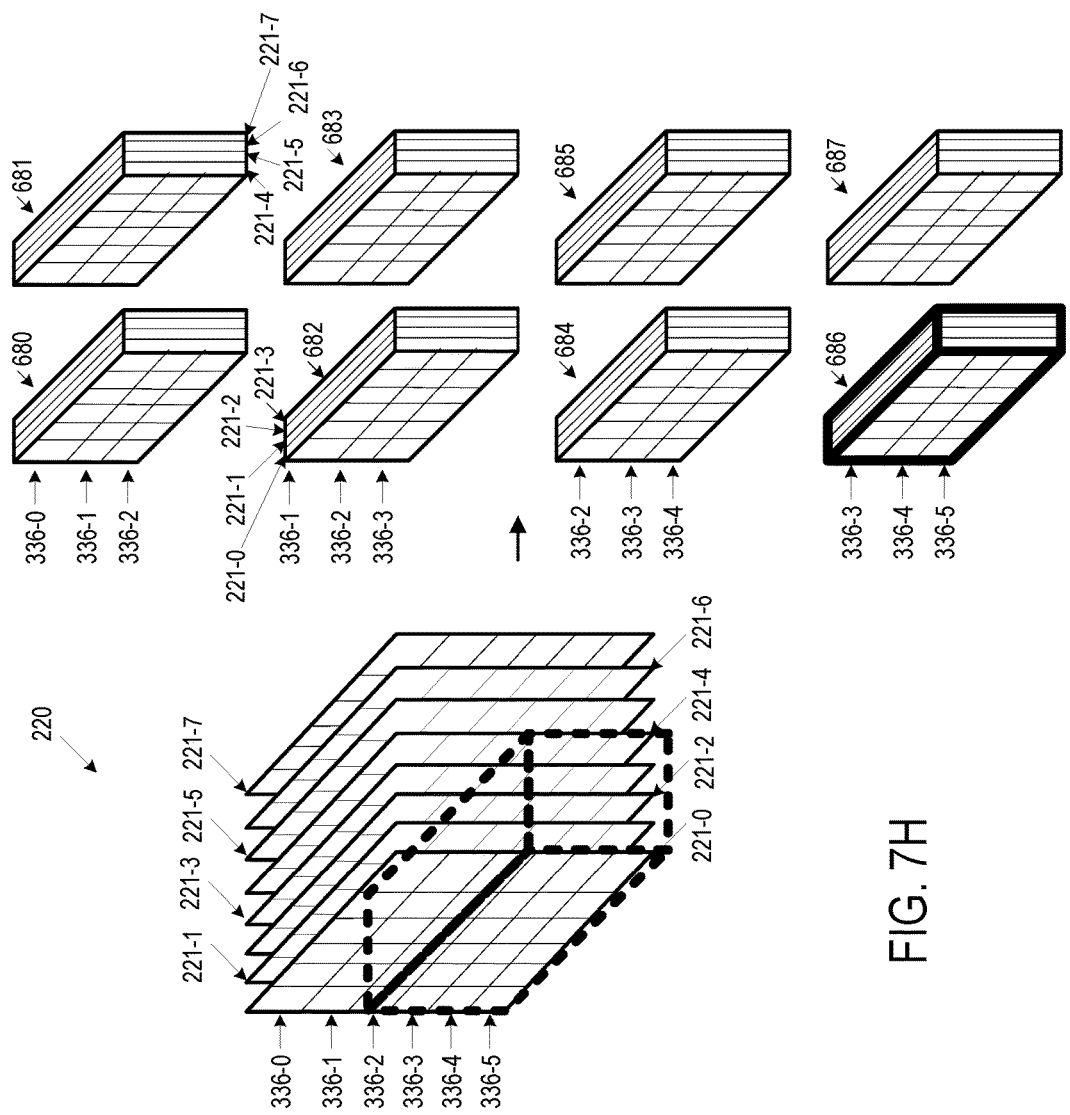

As shown in FIG. 7H, the IFM sub-volume 686 includes the rows 336-3, 336-4, and 336-5 of the 2-D IFM planes 221-0, 221-1, 221-2, and 221-3. MAC operations are performed on the data elements of the IFM sub-volume 686 and the kernel 222 to generate the row 456-3 of the 2-D OFM plane 454-0 of the 3-D OFM 458 shown in FIG. 7A. Similarly, MAC operations are performed on the data elements of the IFM sub-volume 686 and the kernel 224 to generate the row 456-3 of the 2-D OFM plane 454-1 of the 3-D OFM 458 shown in FIG. 7A.

Figure 7I:
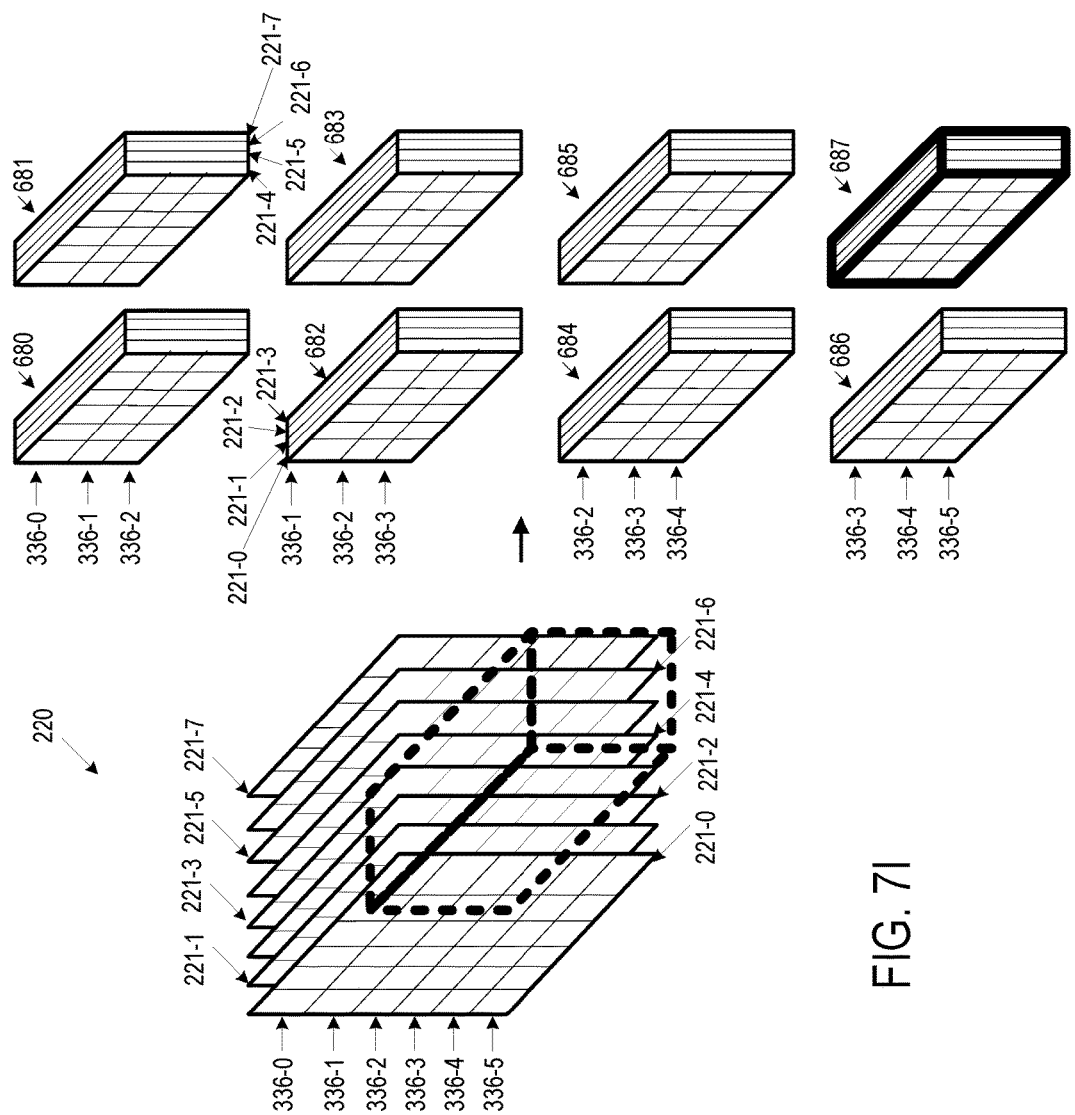

As shown in FIG. 7I, the IFM sub-volume 687 includes the rows 336-3, 336-4, and 336-5 of the 2-D IFM planes 221-4, 221-5, 221-6, and 221-7. MAC operations are performed on the data elements of the IFM sub-volume 687 and the kernel 222 to generate the row 456-3 of the 2-D OFM plane 454-0 of the 3-D OFM 458 shown in FIG. 7A. Similarly, MAC operations are performed on the data elements of the IFM sub-volume 687 and the kernel 224 to generate the row 456-3 of the 2-D OFM plane 454-1 of the 3-D OFM 458 shown in FIG. 7A.

The following pseudocode describes an exemplary algorithm for dividing a 3-D IFM (e.g., 220) into a plurality of IFM sub-volumes as explained above in association with FIGS. 3-5E and 7A-7I. The algorithm generates a set of parameters that are provided to the request generator circuit 110 from which the request generator circuit 100 generates an ordered set of addresses for reading data elements of an IFM sub-volume from the external memory. The parameters include a length of the packet of data 116 (packet_length) that defines (e.g., by a quantity or range of addresses) an amount of data to be read from the external memory 102 for each request 114 (each IFM sub-volume). The parameters include address offsets depth_offset and height_offset. The value of the address offset depth_offset is dependent on N, the number of line buffers 108. If the height (ifm_h) of a 3-D IFM (e.g., 220) is to be divided, then the value of the address offset height_offset is non-zero. The parameters include a number of depth fragments (depth_fragment) and a number of height fragments (height_fragment) 810. If the depth (ifm_d) of a 3-D (e.g., 220) IFM is to be divided then the value of depth_fragment will be greater than one. Similarly, if the height (ifm_h) of a 3-D IFM is to be divided then the value of height_fragment will be greater than one. The number of depth fragments (depth_fragment) and the number of height fragments (height_fragment) are discussed further in association with FIG. 10 below.

```
Func Partition (ifm_h, ifm_w, ifm_d, k_h, k_w, ofm_h, ofm_w, ofm_d, M, N)
{
  If (ifm-h*ifm_w<=m & ifm-d<=n) {//3-D IFM fits in MxN storage
    h=ifm_h
    w=ifm_w
    d=ifm_d
    packet_length=h*w*depth_fragment
    depth_offset=ifm_h*ifm_w*N
    height_offset=0
    height_fragment=1
    depth_fragment=ifm_d/N
  }
  Else {//3-D IFM does not fit in MxN storage
    Divisors( )=divisors(ofm_h)//Find divisors of ofm_h
    imax=floor(m/ifm_w)//find max number of IFM rows
    omax=(imax-k_h)/stride+1//find max number of OFM rows
    //Divisors( ) array is arranged from largest to smallest divisor
    maxNumOFMRows=0
    For (i in divisors( )){
      If (divisors(i)<=omax) {
        maxNumOFMRows=divisors(i)
      }
    }
    //if no whole divisors, find a number that divides the height of the
    //3-D IFM to fit in the line buffers
    If (maxNumOFMRows==0){
      For (i in 2→omax){
        Temp=ceil(ofm_h/i)
        If (temp<=omax)
          maxNumOFMRows=temp
          break;
      }
    }
    //if the criteria is still not met then perform width fragment
    If (maxNumOFMRows==0){
      //Perform width fragment by finding the divisors of ofm_w similar to the algorithm for ofm_h specified above
    }
    //calculate the output parameters
    h=stride*(maxNumOFMRows-1))+k_h
    w=ifm_w
    d=N
    depth_fragment=ifm_d/N
    height-fragment=ceil(ofm-h/maxNumOFMRows)
    packet_length=w*h
    height_offset=maxNumOFMRows*ifm_w*stride*N
    depth_offset=ifm_h*ifm_w*N
  }
  return (packet_length, depth_offset, height_offset, height_fragment, depth_fragment)
}
```

Figure 8:
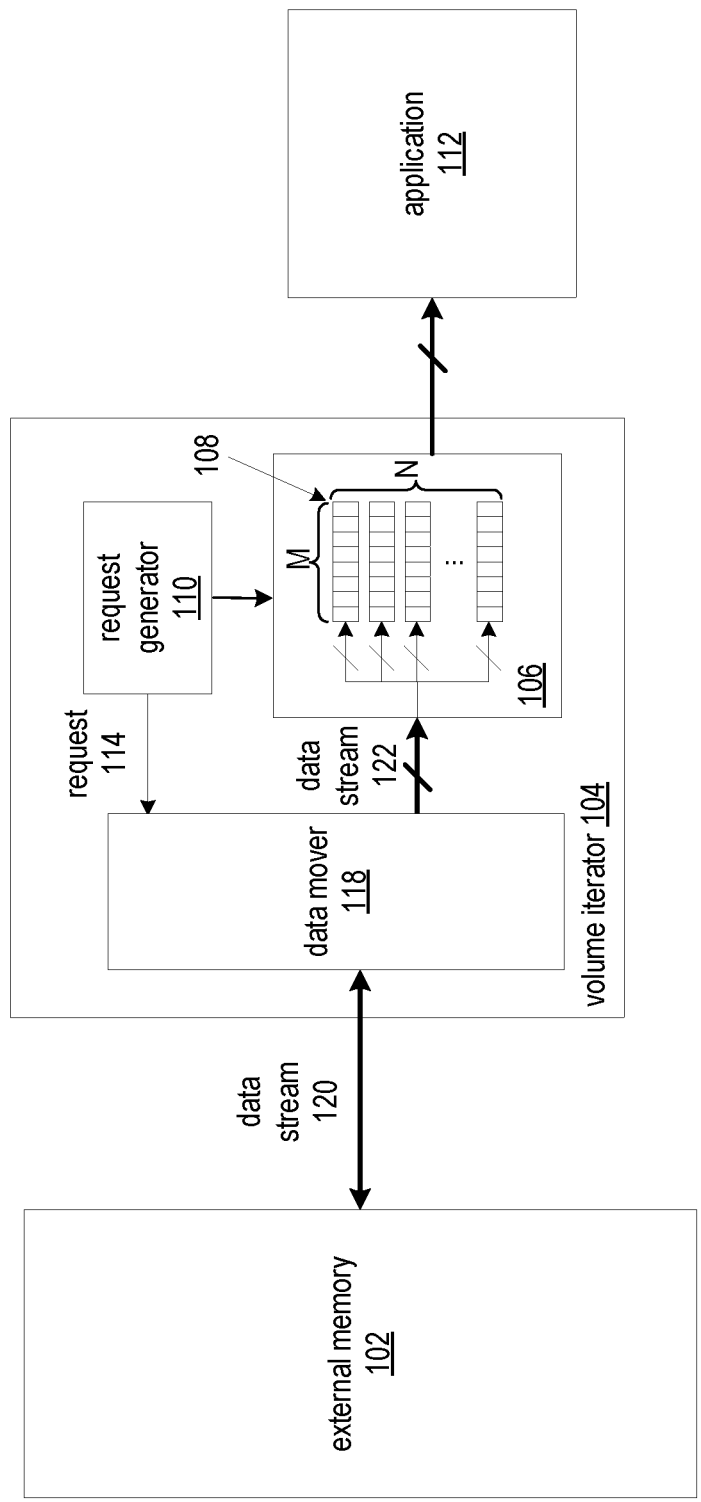
FIG. 8 shows a dataflow of an exemplary circuit arrangement including a request generator circuit and a data mover circuit.

FIG. 8 shows a dataflow of an exemplary circuit arrangement including a request generator circuit 110 and a data mover circuit 118. The external memory 102, buffer circuit 106, and application 112 shown in FIG. 8 can be analogous to the external memory 102, buffer circuit 106, and application 112 shown in FIG. 1. The request generator circuit 110 generates and transmits a request 110 for a packet of data 116 to the data mover circuit 118. The data mover circuit 118 translates the request 114 (e.g., to an Advanced Extensible Interface (AXI) request) and transmits the translated request to the external memory 102 via data stream 120. The data mover circuit 118 receives the requested packet of data via the data stream 120 and transmits the requested packet of data to the N line buffers 108 via the data stream 120.

Figure 9:
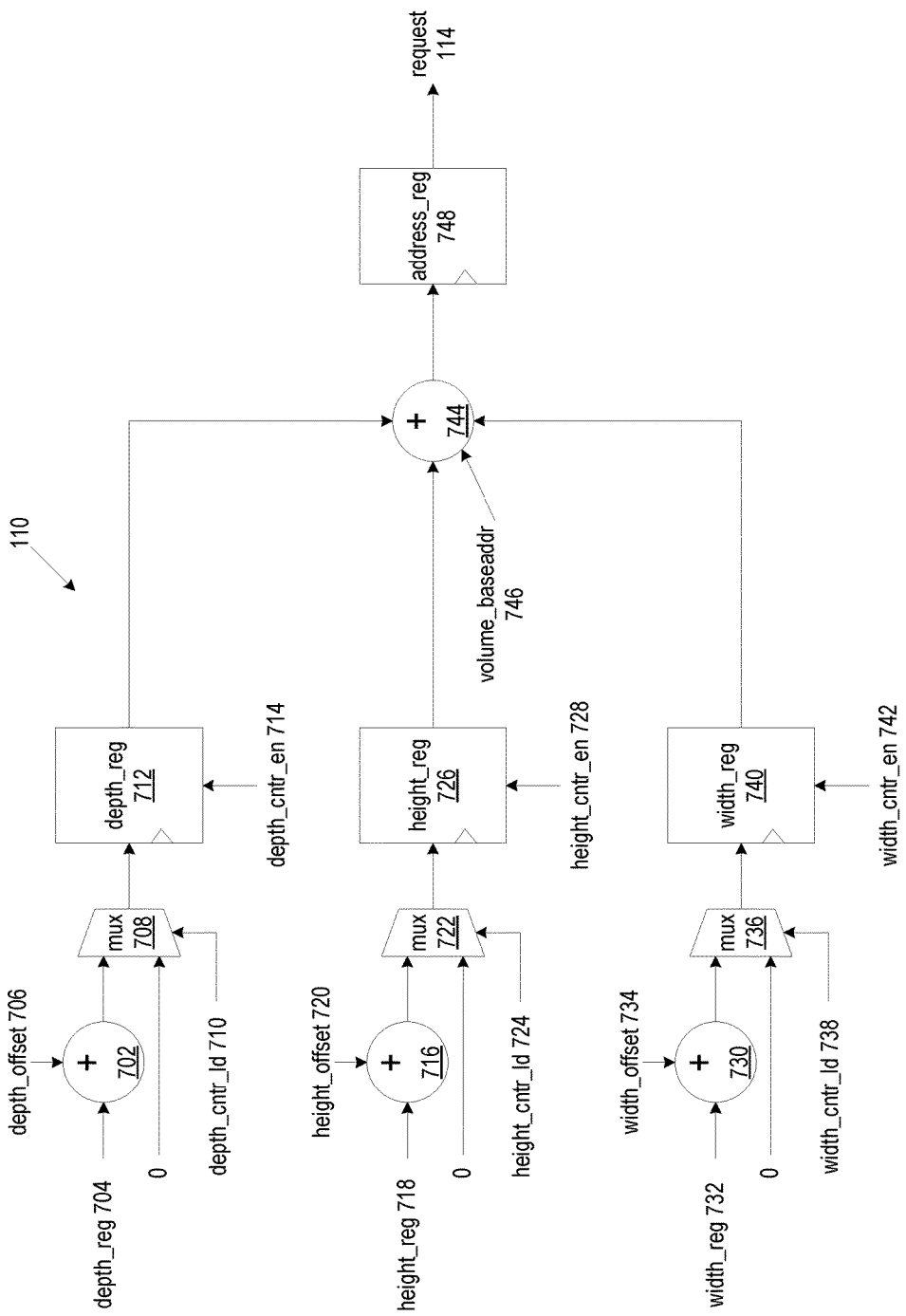
FIG. 9 shows a block diagram of exemplary circuitry of the request generator circuit of FIG. 1.

FIG. 9 shows a block diagram of exemplary circuitry of the request generator circuit 110 of FIG. 1. The request generator circuit 110 includes an adder 702 that receives the address offset depth_offset 706 and a value 704 from the depth_reg register 712. Reading a value from the depth_reg register 712 is enabled by control signal depth_cntr_en 714. The output of the adder 702 is input to a multiplexer 708, which is coupled to an input of the depth_reg register 712. A constant value "0" is also input to the multiplexer 708. Selection of the value written to the depth_reg register 712 is controlled by the load control signal depth_cntr_ld 710 to the multiplexer 708. Initially, the control signal depth_cn-tr_ld 710 selects the input of the multiplexer 708 having the constant value "0". Subsequently, the control signal depth_cntr_ld 710 selects an input of the multiplexer 708 that is the value 704 read from the depth_reg register 712 offset by the address offset depth_offset 706 via the adder 702. The offset value is written to the depth_reg register 712.

The request generator circuit 110 includes an adder 716 that receives the address offset height_offset 720 and a value 718 from the height_reg register 726. Reading a value from the height_reg register 726 is enabled by control signal height_cntr_en 728. The output of the adder 716 is input to a multiplexer 722, which is coupled to an input of the height_reg register 726. A constant value "0" is also input to the multiplexer 722. Selection of the value written to the height_reg register 726 is controlled by the load control signal height_cntr_ld 724 to the multiplexer 722. Initially, the control signal height_cntr_ld 724 selects the input of the multiplexer 722 having the constant value "0". Subsequently, the control signal height_cntr_ld 724 selects an input of the multiplexer 722 that is the value 718 read from the height_reg register 726 offset by the address offset height_offset 720 via the adder 716. The offset value is written to the height_reg register 726.

The request generator circuit 110 can be configured for division of the width (ifm_w) of a 3-D IFM as shown in FIG. 9. The request generator circuit 110 includes an adder 730 that receives an address offset width_offset parameter 734 and a value 732 from the width_reg register 740. Reading a value from the width_reg register 740 is enabled by control signal width_cntr_en 742. The output of the adder 730 is input to a multiplexer 736, which is coupled to an input of the width_reg register 740. A constant value "0" is also input to the multiplexer 736. Selection of the value written to the width_reg register 740 is controlled by the load control signal width_cntr_ld 738 to the multiplexer 736. Initially, the control signal width_cntr_ld 738 selects the input of the multiplexer 736 having the constant value "0". Subsequently, the control signal width_cntr_ld 738 selects an input of the multiplexer 736 that is the value 732 read from the width_reg register 740 offset by the address offset width_offset 734 via the adder 730. The offset value is written to the width_reg register 740.

The request generator circuit 110 includes an adder 744 that receives a value from each of the depth_reg register 712, the height_reg register 726, and the width_reg register 740, and a base address volume_baseaddr 746 and stores the sum in address_reg 748. The base address volume_baseaddr 746 is an address of a respective first data element of a 3-D IFM (e.g., 220). The values (e.g., address offsets) from the depth_reg register 712, the height_reg register 726, and the width_reg register 740 offset the base address volume_baseaddr 746 to the address of a respective first element of one of the IFM sub-volumes (e.g., 230, 338, 446).

Figure 10:
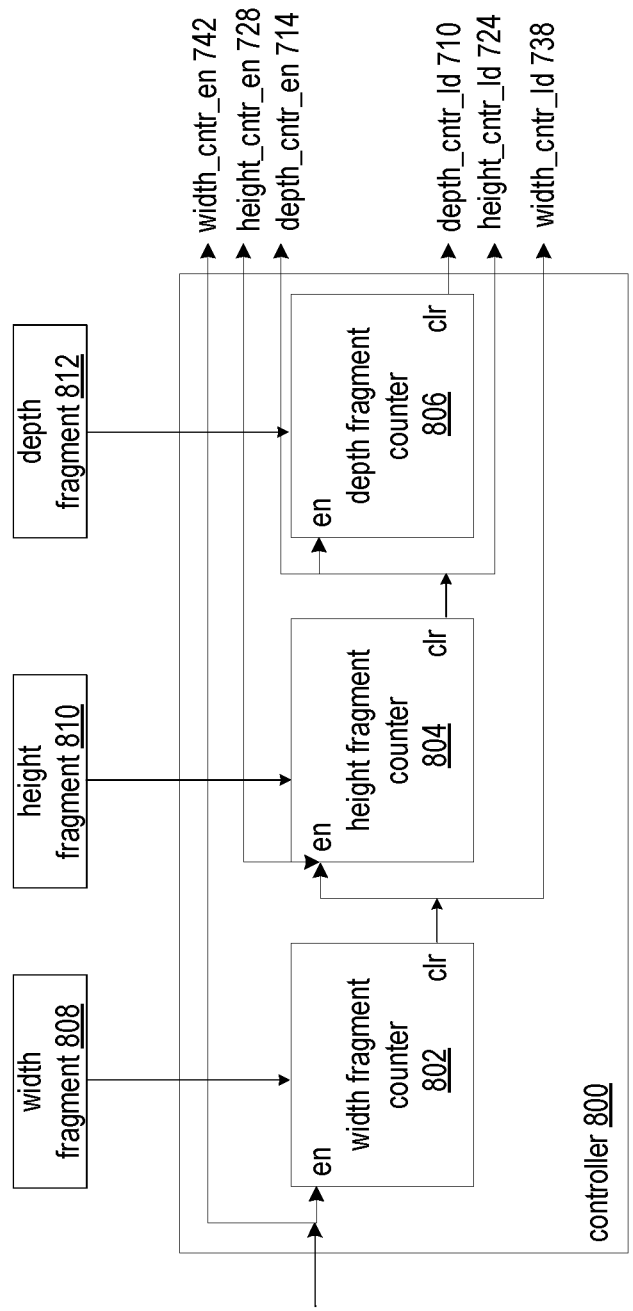
FIG. 10 shows a block diagram of an exemplary controller configured to generate control signals input to the request generator of FIG. 9.

FIG. 10 shows a block diagram of an exemplary controller 800 configured to generate control signals input to the request generator circuit 110 of FIG. 9. The controller 800 includes counters for dividing a 3-D IFM into a plurality of IFM sub-volumes. The value of each counter of the controller 800 begins at zero and resets when the value reaches an upper bound. The depth fragment counter 806 counts from zero to the number of depth fragments (depth_fragment) 812, the height fragment counter 804 counts from zero to the number of height fragments (height_fragment) 810, and the width fragment counter 802 counts from zero to the number of width fragments (width_fragment) 808. The outputs of the counters are the control signals provided to the request generator circuit 110. The width fragment counter 802 outputs the enable control signal width_cntr_en 742 and the load control signal width_cntr_ld 738; the height fragment counter 804 outputs the enable control signal height_cntr_en 728 and the load control signal height_cntr_ld 724; and the depth fragment counter 806 outputs the enable control signal depth_cntr_en 714 and the load control signal depth_cntr_ld 710. The counters 802, 804, and 806 are coupled to one another in a chain so that when one counter resets, as indicated by a clear output signal at the "clr" pin, the next counter increments by one. The clear output of the width fragment counter 802 is coupled to an enable input of height fragment counter 804, and the clear output of the height fragment counter 804 is coupled to an enable input of the depth fragment counter 806.

Figure 11:
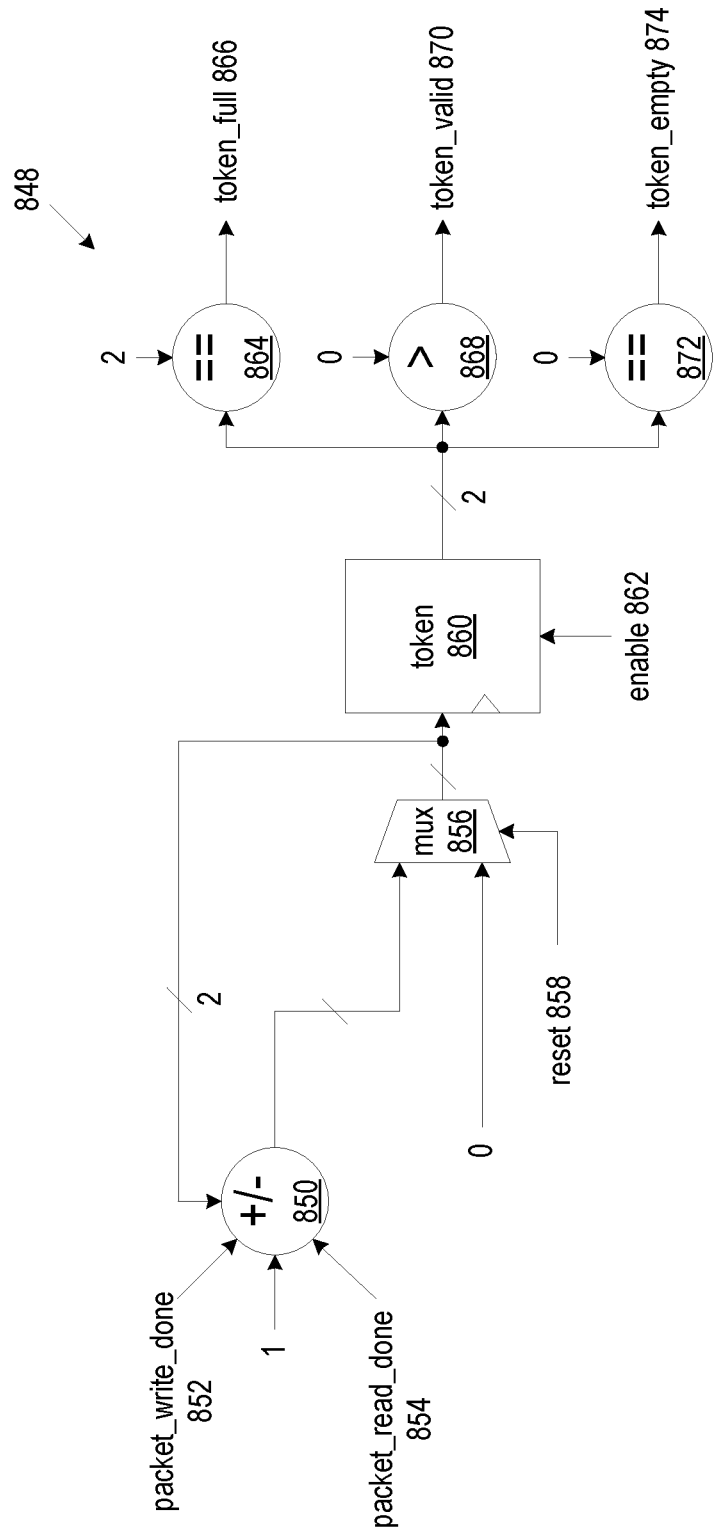
FIG. 11 shows a block diagram of an exemplary token-based control logic for the volume iterator of FIG. 1.

FIG. 11 shows a block diagram of an exemplary token-based control logic 848 of the volume iterator 104 of FIG. 1. In response to a packet of data (e.g., 114) being loaded into the line buffers 108, the buffer circuit 106 provides the packet_write_done signal 852 to the control logic 848 to increase the number of available tokens. In response to completing processing of a packet of data (e.g., performing MAC operations), the application 112 provides the packet_read_done signal 854 to the control logic 848 to reduce the number of available tokens. The control logic 848 outputs status indication signals based on the number of available tokens. The token_empty signal 874 indicates that the line buffers 108 are empty and not currently storing a packet of data for processing. The token_empty signal 874 is input to the application 112 to pause the processing until the next packet of data is ready for processing. The token_valid signal 870 indicates that there is at least one packet of data ready for processing in the line buffers 108. The token_valid signal 870 is input to the application 112 to initiate processing of a packet of data. The token_full signal 866 indicates that, in implementations where the line buffers are double-buffered, both buffers of the line buffers 108 are loaded with packets of data. The token_full signal 866 is used to handle back-pressure and pause a data stream (e.g., the data stream 122 from the data mover circuit 118) until the application 112 has completed processing one of the stored packets of data.

As shown in FIG. 11, the control circuit 848 includes an incrementer/decrementer 850 that receives the packet_write_done signal 852, the constant value "1", the packet_read_done signal 854, and the output of a multiplexer 856. The multiplexer 856 receives the output of the incrementer/decrementer 850 and the constant value "0". A reset signal 858 is provided to the selection input of the multiplexer 856. The output of the multiplexer 856 is input to a token register 860. The token register 860 is configured for storage of a value indicative of the number of available tokens. Reading a value from the token register 860 is controlled by the enable signal 862. The value read from the token register 860 is input to a plurality of comparators to determine which of the status indication signals the control logic 848 outputs.

The value read from the token register 860 is input to the comparator 864 to determine if the number of available tokens is equal to two. If the number of available tokens is equal to two, then the control logic 864 outputs the token_full signal 866. The value read from the token register 860 is input to the comparator 868 to determine if the number of available tokens greater than zero. If the number of available tokens is greater than zero, then the control logic 868 outputs the token_valid signal 870. The value read from the token register 860 is input to the comparator 872 to determine if the number of available tokens is equal to zero. If the number of available tokens is equal to zero, then the control logic 872 outputs the token_empty signal 874.

When a packet of data is loaded in the line buffers 108, the volume iterator circuit 104 passes a token that notifies the application 112 that a packet of data is ready for processing. Subsequently, the application 112 can traverse the line buffers 108 to access the data elements of an IFM sub-volume. The disclosed approaches enable a fluent dataflow while reducing control overhead. The size (M) of the line buffers 108 can be adjusted to improve the balance between the bandwidth of the external memory 102 and the bandwidth of the application 112 (e.g., an array of MAC circuits).

Figure 12:
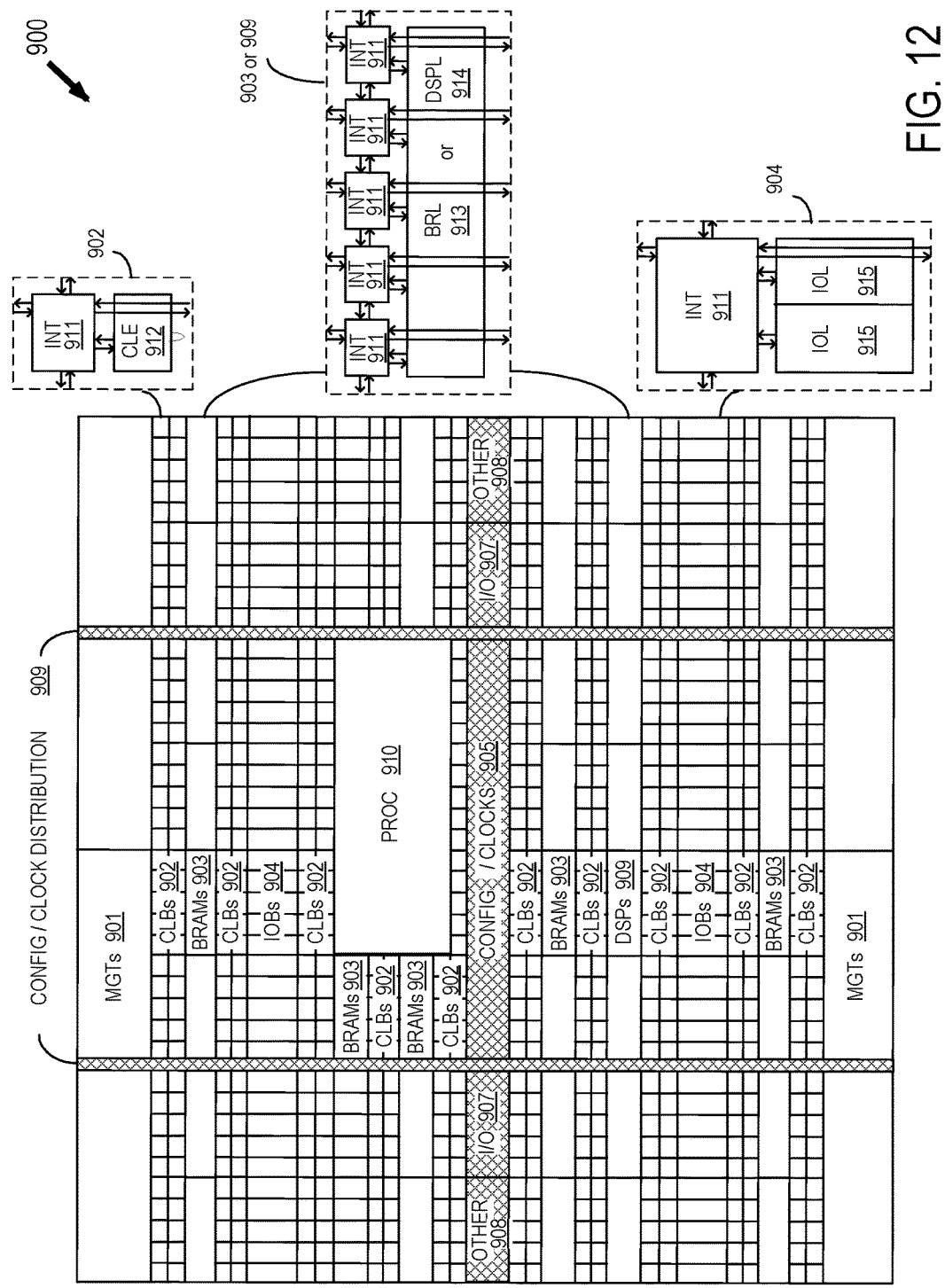
FIG. 12 shows a programmable integrated circuit (IC) on which the disclosed circuits and processes may be implemented.

FIG. 12 shows a programmable integrated circuit (IC) 900 on which the disclosed circuits and processes may be implemented. The programmable IC may also be referred to as a System On Chip (SOC) that includes field programmable gate array logic (FPGA) along with other programmable resources. FPGA logic may include several different types of programmable logic blocks in the array. For example, FIG. 12 illustrates programmable IC 900 that includes a large number of different programmable tiles including multi-gigabit transceivers (MGTs) 901, configurable logic blocks (CLBs) 902, random access memory blocks (BRAMs) 903, input/output blocks (IOBs) 904, configuration and clocking logic (CONFIG/CLOCKS) 905, digital signal processing blocks (DSPs) 909, specialized input/output blocks (I/O) 907, for example, clock ports, and other programmable logic 908 such as digital clock managers, analog-to-digital converters, system monitoring logic, and so forth. Some programmable IC having FPGA logic also include dedicated processor blocks (PROC) 910 and internal and external reconfiguration ports (not shown).

In some FPGA logic, each programmable tile includes a programmable interconnect element (INT) 911 having standardized connections to and from a corresponding interconnect element in each adjacent tile. Therefore, the programmable interconnect elements taken together implement the programmable interconnect structure for the illustrated FPGA logic. The programmable interconnect element INT 911 also includes the connections to and from the programmable logic element within the same tile, as shown by the examples included at the top of FIG. 12.

For example, a CLB 902 can include a configurable logic element CLE 912 that can be programmed to implement user logic, plus a single programmable interconnect element INT 911. A BRAM 903 can include a BRAM logic element (BRL) 913 in addition to one or more programmable interconnect elements. Typically, the number of interconnect elements included in a tile depends on the height of the tile. The illustrated BRAM tile has the same height as five CLBs, but other numbers (e.g., four) can also be used. A DSP tile 909 can include a DSP logic element (DSPL) 914 in addition to an appropriate number of programmable interconnect elements. An 10B 904 can include, for example, two instances of an input/output logic element (IOL) 915 in addition to one instance of the programmable interconnect element INT 911. As will be clear to those of skill in the art, the actual I/O bond pads connected, for example, to the I/O logic element 915, are manufactured using metal layered above the various illustrated logic blocks, and typically are not confined to the area of the input/output logic element 915.

A columnar area near the center of the die (shown shaded in FIG. 12) is used for configuration, clock, and other control logic. Horizontal areas 909 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 12 include additional logic blocks that disrupt the regular columnar structure making up a large part of the programmable IC. The additional logic blocks can be programmable blocks and/or dedicated logic. For example, the processor block PROC 910 shown in FIG. 9 spans several columns of CLBs and BRAMs.

Note that FIG. 12 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 12 are purely exemplary. For example, in an actual programmable IC, more than one adjacent column of CLBs is typically included wherever the CLBs appear, to facilitate the efficient implementation of user logic.

Figure 13:
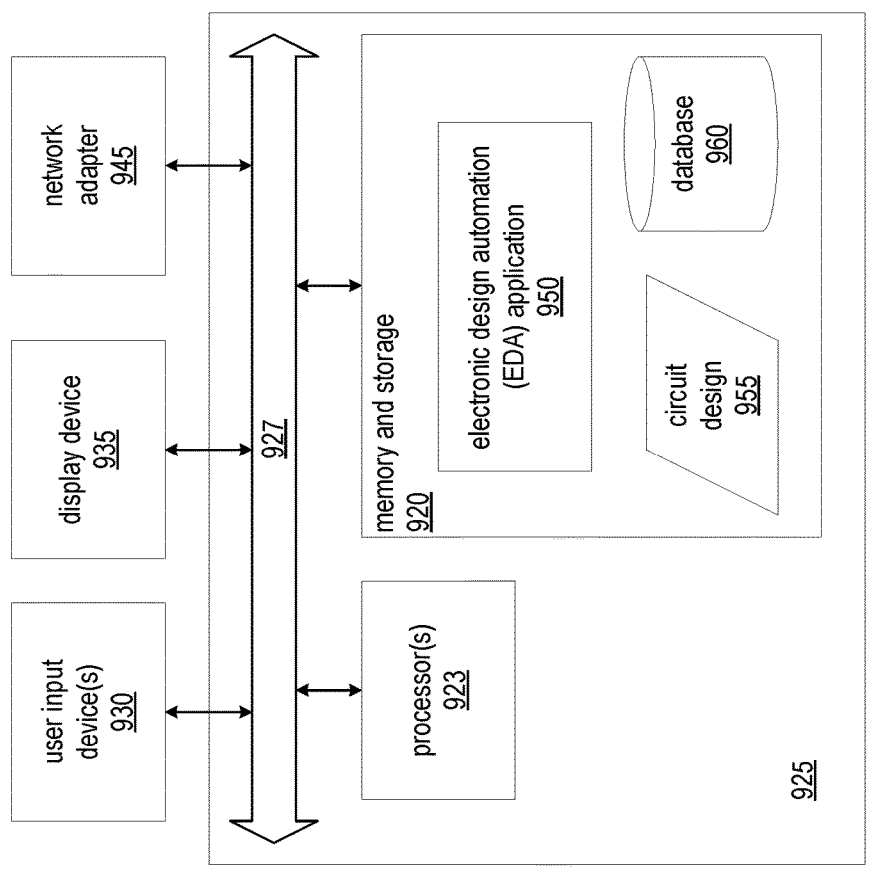
FIG. 13 shows a block diagram illustrating an exemplary data processing system.

FIG. 13 shows a block diagram illustrating an exemplary data processing system (system) 925. System 925 is an example of an EDA system. As pictured, system 925 includes at least one processor circuit (or "processor"), e.g., a central processing unit (CPU) 923 coupled to memory and storage arrangement 920 through a system bus 927 or other suitable circuitry. System 925 stores program code and circuit design 955 within memory and storage arrangement 920. Processor 923 executes the program code accessed from the memory and storage arrangement 920 via system bus 927. In one aspect, system 925 is implemented as a computer or other data processing system that is suitable for storing and/or executing program code. It should be appreciated, however, that system 925 can be implemented in the form of any system including a processor and memory that is capable of performing the functions described within this disclosure.

Memory and storage arrangement 920 includes one or more physical memory devices such as, for example, a local memory (not shown) and a persistent storage device (not shown). Local memory refers to random access memory or other non-persistent memory device(s) generally used during actual execution of the program code. Persistent storage can be implemented as a hard disk drive (HDD), a solid state drive (SSD), or other persistent data storage device. System 925 may also include one or more cache memories (not shown) that provide temporary storage of at least some program code and data in order to reduce the number of times program code and data must be retrieved from local memory and persistent storage during execution.

Input/output (I/O) devices such as user input device(s) 930 and a display device 935 may be optionally coupled to system 925. The I/O devices may be coupled to system 925 either directly or through intervening I/O controllers. A network adapter 945 also can be coupled to system 925 in order to couple system 925 to other systems, computer systems, remote printers, and/or remote storage devices through intervening private or public networks. Modems, cable modems, Ethernet cards, and wireless transceivers are examples of different types of network adapter 945 that can be used with system 925.

Memory and storage arrangement 920 may store an EDA application 950. EDA application 950, being implemented in the form of executable program code, is executed by processor(s) 923. As such, EDA application 950 is considered part of system 925. System 925, while executing EDA application 950, receives and operates on circuit design 955 that includes at least one instance of the volume iterator circuit 104. In one aspect, system 900 performs a design flow on circuit design 955, and the design flow may include synthesis, mapping, placement, and routing. Although, multiple values of the parameters for dividing a 3-D IFM can be stored in the database 960, a single instance of the volume iterator circuit 104 supports all values of the parameters.

EDA application 950, circuit design 955, and any data items used, generated, and/or operated upon by EDA application 950 are functional data structures that impart functionality when employed as part of system 925 or when such elements, including derivations and/or modifications thereof, are loaded into an IC such as a programmable IC causing implementation and/or configuration of a circuit design within the programmable IC.

Though aspects and features may in some cases be described in individual figures, it will be appreciated that features from one figure can be combined with features of another figure even though the combination is not explicitly shown or explicitly described as a combination.

The circuits and methods are thought to be applicable to a variety of systems for formatting data for performing convolution operations. Other aspects and features will be apparent to those skilled in the art from consideration of the specification. The circuits and methods may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A circuit arrangement, comprising:
   a plurality of N line buffers, each line buffer configured for storage of M data elements of a three-dimensional (3-D) input feature map (IFM);
   a request generator circuit coupled to the N line buffers and to a memory configured for storage of the 3-D IFM, wherein the request generator circuit is configured to:
      divide the 3-D IFM into a plurality of IFM sub-volumes based on values of N and M, and dimensions of the 3-D IFM;
      read from the memory data elements at addresses of an unprocessed one of the IFM sub-volumes;
      store the data elements of the unprocessed one of the IFM sub-volumes in the N line buffers; and
      repeat, in response to a completion signal, the reading of an unprocessed one of the IFM sub-volumes and storing the data elements in the N line buffers.

2. The circuit arrangement of claim 1, wherein the request generator circuit is configured to designate, in response to a depth (ifm_d) of the 3-D IFM being greater than the value of N, at least one of the IFM sub-volumes to include N two-dimensional (2-D) IFM planes of the 3-D IFM.

3. The circuit arrangement of claim 2, wherein the request generator circuit is configured to designate, in response to a 2-D IFM plane of the 3-D IFM including more than M data elements, the IFM sub-volumes to include a subset of data elements of the 2-D IFM plane, based on at least one dimension of the 3-D IFM, at least one dimension of a kernel, and a stride.

4. The circuit arrangement of claim 1, wherein the request generator circuit is configured to designate, in response to a two-dimensional (2-D) IFM plane of the 3-D IFM (220) including more than m data elements, the IFM sub-volumes to include a subset of data elements of the 2-D IFM plane, based on at least one dimension of the 3-D IFM, at least one dimension of a kernel, and a stride.

5. The circuit arrangement of claim 4, wherein:
   the request generator circuit is configured to designate the IFM sub-volumes to include the subset of data elements of the 2-D IFM plane of the 3-D IFM for generating a maximum number of rows of a 3-D OFM, and
   the maximum number of rows of the 3-D OFM is based on:
      an integer multiple of the width of the 3-D IFM that is less than or equal to the M data elements,
      the height of the kernel, and
      the stride.

6. The circuit arrangement of claim 4, wherein:
   the request generator circuit is configured to designate the IFM sub-volumes to include the subset of data elements of the 2-D IFM plane of the 3-D IFM for generating a maximum number of columns of a 3-D OFM, and
   the maximum number of columns of the 3-D OFM is based on:
      an integer multiple of the height of the 3-D IFM that is less than or equal to the m data elements,
      the width of the kernel, and
      the stride.

7. The circuit arrangement of claim 1, further comprising an array of multiply-and-accumulate (MAC) circuits coupled to the N line buffers and configured to:
   perform MAC operations on the data elements of the unprocessed one of the IFM sub-volumes read from the N line buffers;
   provide the completion signal to the request generator upon completion of reading the data elements of the unprocessed one of the IFM sub-volumes from the N line buffers; and
   repeat, in response to the completion signal, the performing of MAC operations on an unprocessed one of the IFM sub-volumes and storing the data elements in the N line buffers.

8. The circuit arrangement of claim 7, further comprising a control logic circuit coupled to the array of MAC circuits and the request generator circuit, wherein the control logic circuit is configured to:
   pause performing the MAC operations in response to determining that the N line buffers are empty;
   initiate performing the MAC operations in response to determining that at least one of the N line buffers are storing the data elements of the unprocessed one of the IFM sub-volumes; and
   pause a data stream to the N line buffers in response to determining that all the N line buffers are storing data elements of unprocessed ones of the IFM sub-volumes.

9. The circuit arrangement of claim 1, further comprising a control circuit coupled to the request generator circuit and configured to:
   input an IFM depth fragment value, an IFM height fragment value, and an IFM width fragment value; and
   generate control signals at times based on the IFM depth fragment value, the IFM height fragment value, and the IFM width fragment value,
   wherein:
      the request generator circuit is configured to generate a request for one of the IFM sub-volumes based on the control signals; and
      the request includes a base address and a packet length encompassing a range of addresses corresponding to the IFM sub-volume.

10. The circuit arrangement of claim 1, further comprising:
    a processor circuit coupled to the plurality of line buffers, wherein:

the processor circuit is configured to read the data elements from the N line buffers and process the data elements;

each of the N line buffers includes a first sub-buffer and a second sub-buffer; and the request generator circuit is configured to:
store the data elements of a first unprocessed one of the IFM sub-volumes in the first sub-buffers of the N line buffers; and
concurrent with reading of the data elements of the first unprocessed one of the IFM sub-volumes in the first sub-buffers of the N line buffers by the processor circuit:
read, from the memory, the data elements of another unprocessed one of the IFM sub-volumes; and
store the data elements of the second unprocessed one of the IFM sub-volumes in the second sub-buffers of the N line buffers.

11. A method, comprising:
dividing, by a request generator circuit, a three-dimensional (3-D) input feature map (IFM) into a plurality of IFM sub-volumes based on values of N and M, and dimensions of the 3-D IFM, wherein N>1 and M>1 and:
the request generator circuit is coupled to a plurality of N line buffers and to a memory configured for storage of the 3-D IFM, and
each of the N line buffers is configured for storage of M data elements of the 3-D IFM;
reading, by the request generator circuit and from the memory, data elements of an unprocessed one of the IFM sub-volumes;
storing, by the request generator circuit, the data elements of the unprocessed one of the IFM sub-volumes in the N line buffers; and
repeating, by the request generator circuit in response to a completion signal, the reading of an unprocessed one of the IFM sub-volumes and storing the data elements in the N line buffers.

12. The method of claim 11, further comprising, designating, by the request generator circuit in response to a depth of the 3-D IFM being greater than the value of N, at least one of the IFM sub-volumes to include N two-dimensional (2-D) IFM planes of the 3-D IFM.

13. The method of claim 12, further comprising, designating, by the request generator circuit in response to a two-dimensional (2-D) IFM plane of the 3-D IFM including more than m data elements, the IFM sub-volumes to include a subset of data elements of the 2-D IFM plane, based on at least one dimension of the 3-D IFM, at least one dimension of a kernel, and a stride.

14. The method of claim 11, further comprising, designating, by the request generator circuit in response to a two-dimensional (2-D) IFM plane of the 3-D IFM including more than m data elements, the IFM sub-volumes to include a subset of data elements of the 2-D IFM plane, based on at least one dimension of the 3-D IFM, at least one dimension of a kernel, and a stride.

15. The method of claim 14, further comprising, designating, by the request generator circuit, the IFM sub-volumes to include the subset of data elements of the 2-D IFM plane of the 3-D IFM for generating a maximum number of rows of the a 3-D OFM,
wherein the maximum number of rows of the 3-D OFM is based on:
an integer multiple of the width of the 3-D IFM that is less than or equal to the M data elements,
the height of the kernel, and
the stride.

16. The method of claim 14, further comprising, designating, by the request generator circuit, the IFM sub-volumes to include the subset of data elements of the 2-D IFM plane for generating a maximum number of columns of a 3-D OFM,
wherein the maximum number of columns of the 3-D OFM is based on:
an integer multiple of the height of the 3-D IFM that is less than or equal to the m data elements,
the width of the kernel, and
the stride.

17. The method of claim 11, further comprising:
performing, by an array of multiply-and-accumulate (MAC) circuits coupled to the N line buffers, MAC operations on the data elements of the unprocessed one of the IFM sub-volumes read from the N line buffers;
providing, by the array of MAC circuits, the completion signal to the request generator upon completion of reading the data elements of the unprocessed one of the IFM sub-volumes from the N line buffers; and
repeating, by the array of MAC circuits in response to the completion signal, the performing of MAC operations on an unprocessed one of the IFM sub-volumes and storing the data elements in the N line buffers.

18. The method of claim 17, further comprising:
pausing, by a control logic circuit coupled to the array of MAC circuits and the request generator circuit, performing the MAC operations in response to determining that the N line buffers are empty;
initiating, by the control logic circuit, performing the MAC operations in response to determining that at least one of the N line buffers are storing the data elements of the unprocessed one of the IFM sub-volumes; and
pausing, by the control logic circuit, a data stream to the N line buffers in response to determining that all the N line buffers are storing data elements of unprocessed ones of the IFM sub-volumes.

19. The method of claim 11, further comprising:
inputting to a control circuit coupled to the request generator circuit an IFM depth fragment value, an IFM height fragment value (810), and an IFM width fragment value;
generating, by the control circuit, control signals at times based on the IFM depth fragment value, the IFM height fragment value, and the IFM width fragment value; and
generating, by the request generator circuit, a request for one of the IFM sub-volumes based on the control signals, wherein the request includes a base address and a packet length encompassing a range of addresses corresponding to the IFM sub-volume.

20. The method of claim 11, further comprising:
reading, a processor circuit coupled to the plurality of N line buffers, the data elements from the N line buffers and process the data elements, wherein each of the N line buffers includes a first sub-buffer and a second sub-buffer;
storing, by the request generator circuit, the data elements of a first unprocessed one of the IFM sub-volumes in the first sub-buffers of the N line buffers; and
concurrent with reading of the data elements of the first unprocessed one of the IFM sub-volumes in the first sub-buffers of the N line buffers by the processor circuit:

reading, by the request generator circuit and from the memory, the data elements of another unprocessed one of the IFM sub-volumes; and storing, by the request generator circuit, the data elements of the second unprocessed one of the IFM sub-volumes in the second sub-buffers of the N line buffers.

\* \* \* \* \*